United States Patent
Imada et al.

(10) Patent No.: US 10,414,850 B2
(45) Date of Patent: Sep. 17, 2019

(54) RESIN CONTAINING PHENOLIC HYDROXYL GROUPS, AND RESIST FILM

(71) Applicant: DIC Corporation, Tokyo (JP)

(72) Inventors: Tomoyuki Imada, Ichihara (JP); Yusuke Sato, Ichihara (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 15/775,921

(22) PCT Filed: Nov. 17, 2016

(86) PCT No.: PCT/JP2016/084054
§ 371 (c)(1),
(2) Date: May 14, 2018

(87) PCT Pub. No.: WO2017/094516
PCT Pub. Date: Jun. 8, 2017

(65) Prior Publication Data
US 2018/0327533 A1 Nov. 15, 2018

(30) Foreign Application Priority Data

Dec. 2, 2015 (JP) ................................ 2015-235645

(51) Int. Cl.
| | |
|---|---|
| *C08G 8/30* | (2006.01) |
| *G03F 7/039* | (2006.01) |
| *C08G 8/20* | (2006.01) |
| *C08L 61/12* | (2006.01) |
| *G03F 7/023* | (2006.01) |
| *C08G 8/04* | (2006.01) |

(52) U.S. Cl.
CPC ............... *C08G 8/30* (2013.01); *C08G 8/20* (2013.01); *C08L 61/12* (2013.01); *G03F 7/0236* (2013.01); *G03F 7/039* (2013.01); *C08G 8/04* (2013.01)

(58) Field of Classification Search
None
See application file for complete search history.

(56) References Cited

U.S. PATENT DOCUMENTS

| 5,723,254 A | * | 3/1998 | Zampini | .................. C08G 8/28 430/190 |
| 2017/0121444 A1 | * | 5/2017 | Imada | ...................... C08G 8/08 |

FOREIGN PATENT DOCUMENTS

| JP | 02-055359 A | | 2/1990 |
| JP | 11202485 A | * | 7/1999 |
| WO | 2015/141427 A1 | | 9/2015 |

OTHER PUBLICATIONS

English Machine Translation of JPH11-202485 (Year: 2019).*
International Search Report dated Jan. 31, 2017, issued for PCT/JP2016/084054.

* cited by examiner

*Primary Examiner* — Christopher M Rodd
(74) *Attorney, Agent, or Firm* — Locke Lord LLP

(57) ABSTRACT

Provided are a resin containing phenolic hydroxyl groups having excellent developability, heat resistance, and substrate followability, a photosensitive composition, a curable composition, and a resist film which contain the resin containing phenolic hydroxyl group. The resin containing phenolic hydroxyl groups obtained by reacting a novolac resin intermediate obtained by reacting a triarylmethane compound (A) with an aldehyde compound (B) as essential components, with an alkene compound (C) having 9 to 24 carbon atoms, a photosensitive composition, a curable composition, and a resist film which contain the resin containing phenolic hydroxyl groups.

5 Claims, 10 Drawing Sheets

RESIN CONTAINING PHENOLIC HYDROXYL GROUPS, AND RESIST FILM

TECHNICAL FIELD

The present invention relates to a resin containing phenolic hydroxyl groups having excellent developability, heat resistance, and substrate followability, and a resist film formed using the same.

BACKGROUND ART

A resin containing phenolic hydroxyl groups is used in an adhesive, a molding material, paint, a photoresist material, an epoxy resin raw material, a curing agent for an epoxy resin, and the like. Since the heat resistance and moisture resistance of the cured product of the resin containing phenolic hydroxyl groups are excellent, the resin is also widely used in the electrical and electronic field such as a semiconductor sealing material or an insulating material for a printed wiring board, as a curable composition including the resin containing phenolic hydroxyl groups itself as a main agent or as a curing agent of an epoxy resin or the like.

Among these, in the field of a photoresist, a wide variety of resist pattern forming methods subdivided according to the use or the function have been developed one after another. Accordingly, performances required for a resin material for a resist have become more sophisticated and diversified. For example, high developability is required in order to accurately form a fine pattern on a highly-integrated semiconductor with high production efficiency, a cured product is required to have properties of being flexible and hard to be broken in the case of forming a thick film, and dry etching resistance and heat resistance are required in the case of a resist underlayer film. Further, toughness such as substrate followability, as well as the high heat resistance, is required in the case of a resist permanent film.

CITATION LIST

Patent Literature

[PTL 1] JP-A-2-55359

SUMMARY OF INVENTION

Technical Problem

Accordingly, an object of the present invention is to provide a resin containing phenolic hydroxyl groups having excellent developability, heat resistance, and substrate followability, a photosensitive composition and a curable composition including the same, and a resist film.

Solution to Problem

The present inventors have conducted extensive research in order to solve the problem, and as a result, they have found that a resin containing phenolic hydroxyl groups obtained by converting a triarylmethane compound having a phenolic hydroxyl group into a novolac and modifying the novolac with a long chain hydrocarbon group has excellent developability, heat resistance, and substrate followability, thus completing the present invention.

That is, the present invention relates to a resin containing phenolic hydroxyl groups including, as a repeating unit, a structural moiety represented by Structural Formula (1):

[Chem. 1]

(1)

in the formula, $R^1$ represents any one of a hydrogen atom, an alkyl group, and an aryl group. X is a structural moiety ($\alpha$) represented by Structural Formula (2) or a structural moiety (($\beta$) represented by Structural Formula (3):

[Chem. 2]

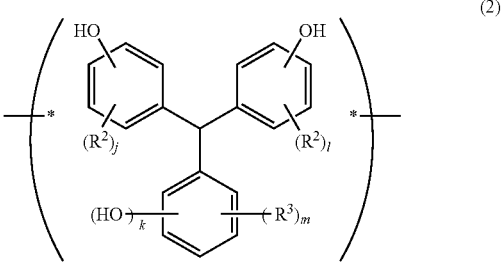

(2)

(in the formula, k is any one of 0, 1, and 2, $R^2$'s each independently represent any one of a hydrogen atom, an aliphatic hydrocarbon group, an aromatic ring-containing hydrocarbon group, an alkoxy group, and a halogen atom, and 1's are each independently an integer of 1 to 4, $R^3$ represents any one of a hydrogen atom, an aliphatic hydrocarbon group, an aromatic ring-containing hydrocarbon group, an alkoxy group, and a halogen atom, and m is an integer of 1 to 4, asterisks are a bonding point on any of the three aromatic rings shown in the formula, and two asterisks may be bonded to the same aromatic ring or may be bonded to different aromatic rings)

[Chem. 3]

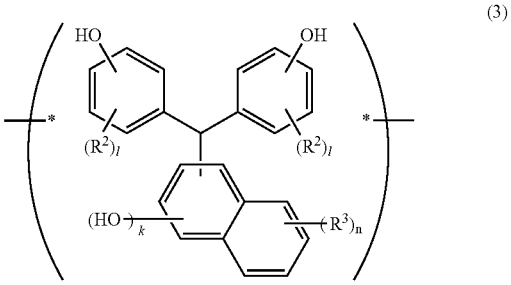

(3)

(in the formula, k is any one of 0, 1, and 2, $R^2$'s each independently represent any one of a hydrogen atom, an aliphatic hydrocarbon group, an aromatic ring-containing hydrocarbon group, an alkoxy group, and a halogen atom, 1's are each independently an integer of 1 to 4, $R^3$ represents any one of a hydrogen atom, an aliphatic hydrocarbon group, an aromatic ring-containing hydrocarbon group, an alkoxy group, and a halogen atom, n is an integer of 1 to 6, asterisks are a bonding point on any of the three aromatic rings shown, and two asterisks may be bonded to the same aromatic ring or may be bonded to different aromatic rings), in which at least one of $R^2$ and $R^3$ present in the resin is an aliphatic hydrocarbon group having 9 to 24 carbon atoms.

The present invention further relates to a method of producing a resin containing phenolic hydroxyl groups including reacting a novolac resin intermediate obtained by reacting a triarylmethane compound (A) having a molecular structure represented by Structural Formula (4) or (5) with an aldehyde compound (B) as essential components, with an alkene compound (C) having 9 to 24 carbon atoms:

[Chem. 4]

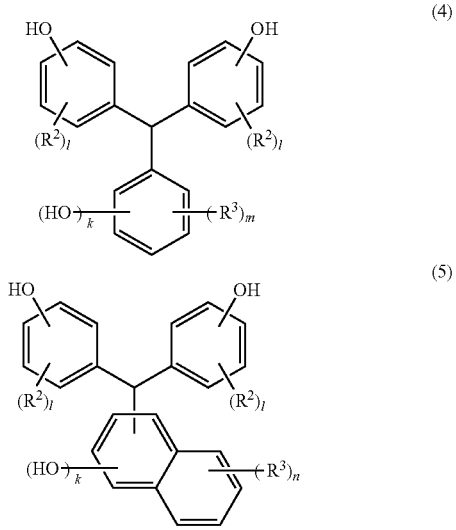

(4)

(5)

(in the formulae, k is any one of 0, 1, and 2, $R^2$'s each independently represent any one of a hydrogen atom, an aliphatic hydrocarbon group, an aromatic ring-containing hydrocarbon group, an alkoxy group, and a halogen atom, l's are each independently an integer of 1 to 4, $R^3$ represents any one of a hydrogen atom, an aliphatic hydrocarbon group, an aromatic ring-containing hydrocarbon group, an alkoxy group, and a halogen atom, m is an integer of 1 to 4, and n is an integer of 1 to 6).

The present invention further relates to a photosensitive composition including the resin containing phenolic hydroxyl groups and a photosensitizing agent.

The present invention further relates to a resist film formed from the photosensitive composition.

The present invention further relates to a curable composition including the resin containing phenolic hydroxyl groups and a curing agent.

The present invention further relates to a cured product of the curable composition.

The present invention further relates to a resist film formed from the curable composition.

Advantageous Effects of Invention

According to the present invention, a resin containing phenolic hydroxyl groups having excellent developability, heat resistance, and substrate followability, a photosensitive composition and a curable composition including the same, and a resist film can be provided.

DESCRIPTION OF EMBODIMENTS

Figure 1:
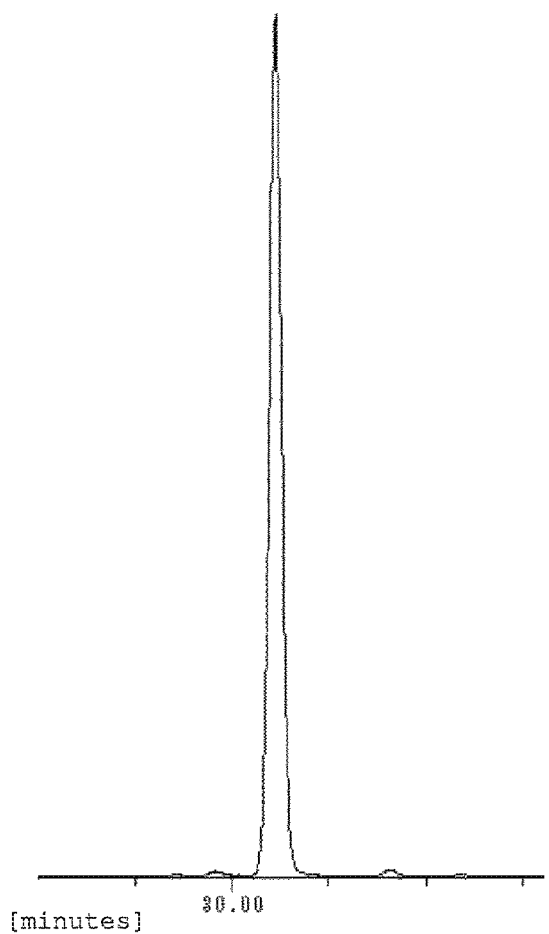
FIG. 1 is a GPC chart diagram of a triarylmethane compound (A-1) obtained in Production Example 1.

A resin containing phenolic hydroxyl groups includes, as a repeating unit, a structural moiety represented by Structural Formula (1):

[Chem. 5]

(1)

[in the formula, $R^1$ represents anyone of a hydrogen atom, an alkyl group, and an aryl group. X is a structural moiety (α) represented by Structural Formula (2) or a structural moiety (β) represented by Structural Formula (3):

[Chem. 6]

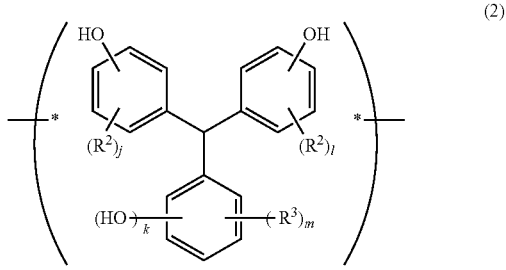

(2)

(in the formula, k is any one of 0, 1, and 2, $R^2$'s each independently represent any one of a hydrogen atom, an aliphatic hydrocarbon group, an aromatic ring-containing hydrocarbon group, an alkoxy group, and a halogen atom, and l's are each independently an integer of 1 to 4, $R^3$ represents any one of a hydrogen atom, an aliphatic hydrocarbon group, an aromatic ring-containing hydrocarbon group, an alkoxy group, and a halogen atom, m is an integer of 1 to 4, asterisks are a bonding point on any of the three aromatic rings shown in the formula, and two asterisks may be bonded to the same aromatic ring or may be bonded to different aromatic rings):

[Chem. 7]

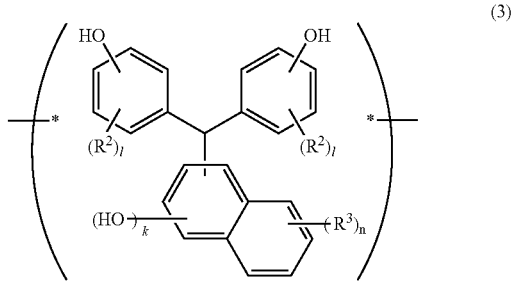

(3)

(in the formula, k is any one of 0, 1, and 2, $R^2$'s each independently represent any one of a hydrogen atom, an aliphatic hydrocarbon group, an aromatic ring-containing hydrocarbon group, an alkoxy group, and a halogen atom, 1's are each independently an integer of 1 to 4, $R^3$ represents any one of a hydrogen atom, an aliphatic hydrocarbon group, an aromatic ring-containing hydrocarbon group, an alkoxy group, and a halogen atom, n is an integer of 1 to 6, asterisks are a bonding point on any of the three aromatic rings shown, and two asterisks may be bonded to the same aromatic ring or may be bonded to different aromatic rings), in which at least one of $R^2$ and $R^3$ present in the resin is an aliphatic hydrocarbon group having 9 to 24 carbon atoms.

The resin containing phenolic hydroxyl groups of the present invention has a rigid and highly symmetric triarylmethane structure as a repeating unit, and has a phenolic hydroxyl group at a high density, and thereby it has high heat resistance and excellent developability. In the present invention, by further introducing an aliphatic hydrocarbon group having 9 to 24 carbon atoms into the resin structure, a resin excellent in heat resistance and developability as well as substrate followability is realized. Generally, in the case where a long chain aliphatic hydrocarbon group is introduced in order to improve the flexibility and toughness of the resin, it is usual that deterioration of the developability accompanying a decrease in functional group density and deterioration of the heat resistance occur. However, in the present invention, a resin containing phenolic hydroxyl groups having excellent developability, the heat resistance, and the substrate followability is obtained without trade-off of such effects.

$R^1$ in Structural Formula (1) represents any one of a hydrogen atom, an alkyl group, and an aryl group. Examples of the alkyl group include an alkyl group having 1 to 9 carbon atoms such as alkyl groups of a methyl group, an ethyl group, a propyl group, an isopropyl group, a butyl group, a t-butyl group, a pentyl group, a hexyl group, a cyclohexyl group, a heptyl group, an octyl group, and a nonyl group. Examples of the aryl group include a phenyl group, a tolyl group, a xylyl group, a naphthyl group, an anthryl group, and structural moieties in which an alkyl group or an alkoxy group, a halogen atom, and the like are substituted on these aromatic nuclei. Among them, in view of obtaining a phenolic hydroxyl group excellent in the heat resistance, $R^1$ is preferably a hydrogen atom or an alkyl group having 1 to 6 carbon atoms, and is more preferably a hydrogen atom.

X in Structural Formula (1) is a structural moiety (α) represented by Structural Formula (2) or a structural moiety (β) represented by Structural Formula (3). Asterisks in Structural Formulae (2) and (3) are a bonding point on any of the three aromatic rings shown in Structural Formulae (2) and (3), two asterisks may be bonded to the same aromatic ring or may be bonded to different aromatic rings. That is, specific examples of the structural moiety (α) represented by Structural Formula (2) include those represented by any one of Structural Formulae (2-1) to (2-4), and specific examples of the structural moiety (β) represented by Structural Formula (3) includes those represented by any one of Structural Formulae (3-1) to (3-4).

[Chem. 8]

(2-1)

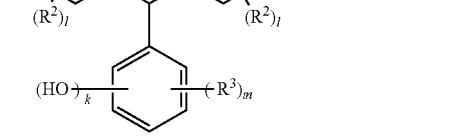

(2-2)

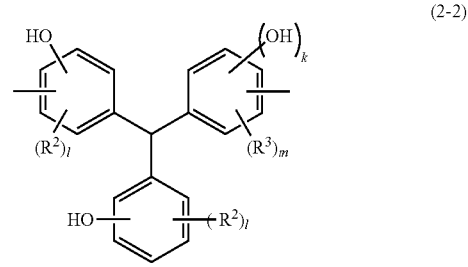

(2-3)

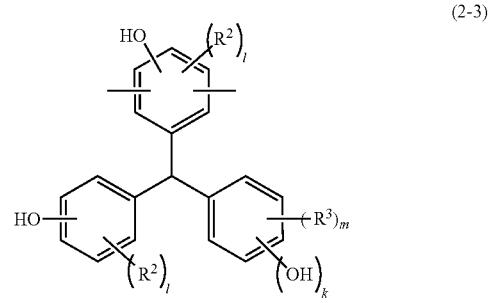

(2-4)

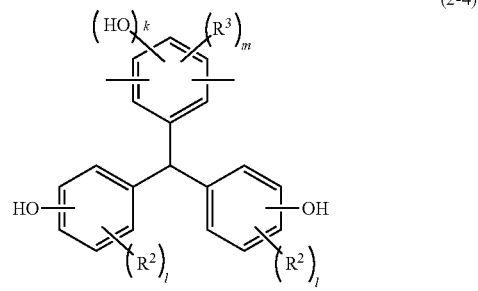

(In the formulae, k is any one of 0, 1, and 2, $R^2$'s each independently represent any one of a hydrogen atom, an aliphatic hydrocarbon group, an aromatic ring-containing hydrocarbon group, an alkoxy group, and a halogen atom, and 1's are each independently an integer of 1 to 4. $R^3$ represents any one of a hydrogen atom, an aliphatic hydrocarbon group, an aromatic ring-containing hydrocarbon group, an alkoxy group, and a halogen atom, and m is an integer of 1 to 4.)

[Chem. 9]

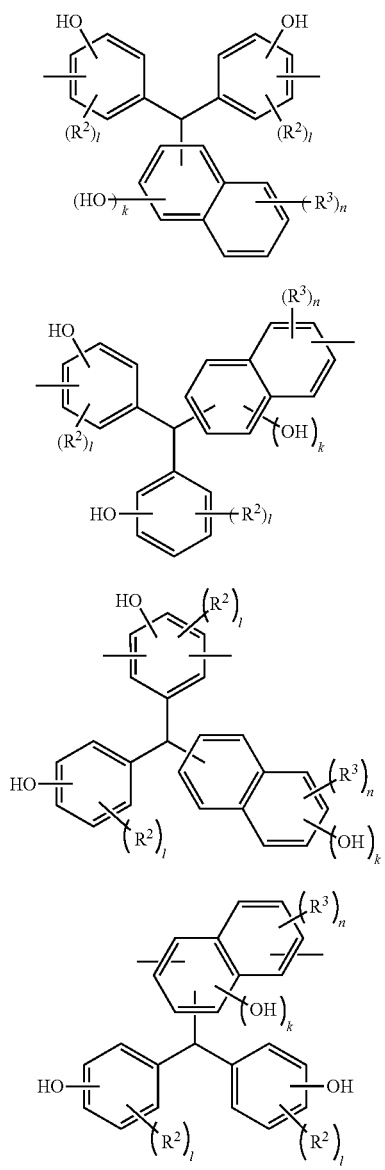

(In the formulae, k is any one of 0, 1, and 2. $R^2$'s each independently represent any one of a hydrogen atom, an aliphatic hydrocarbon group, an aromatic ring-containing hydrocarbon group, an alkoxy group, and a halogen atom, and l's are each independently an integer of 1 to 4. $R^3$ represents any one of a hydrogen atom, an aliphatic hydrocarbon group, an aromatic ring-containing hydrocarbon group, an alkoxy group, and a halogen atom, and n is an integer of 1 to 6.)

In the resin containing phenolic hydroxyl groups of the present invention, all of X's present in the resin may have the same structure or may have a plurality of different structures. Among them, in view of obtaining the resin containing phenolic hydroxyl groups excellent in balance between the developability, the heat resistance, and the substrate followability, the structural moiety (α) represented by Structural Formula (2) is preferable. 20 mol % or more of X is preferably a structural moiety in which a value of k is 1. In the case where the value of k is 1, in the structural moiety (α), a bonding position of three phenolic hydroxyl groups in the structural formula is preferably a para position with respect to a methine group linking three aromatic rings.

$R^2$ in Structural Formulae (2) and (3) is any one of a hydrogen atom, an aliphatic hydrocarbon group, an aromatic ring-containing hydrocarbon group, an alkoxy group, and a halogen atom. The aliphatic hydrocarbon group may be either a linear type or a branched type, and may be either a group having an unsaturated group in the structure or a group having no unsaturated group in the structure. The number of carbon atoms thereof is not particularly limited, and may be either a short chain having 1 to 6 carbon atoms or a relatively long chain having 7 or more carbon atoms. The aromatic ring-containing hydrocarbon group is not particularly limited as long as it is a structural moiety containing an aromatic ring, and examples thereof include an aralkyl group such as a benzyl group, a phenylethyl group, a phenylpropyl group, and a naphthylmethyl group in addition to an aryl group such as a phenyl group, a tolyl group, a xylyl group, a naphthyl group, and an anthryl group. Examples of the alkoxy group include a methoxy group, an ethoxy group, a propyloxy group, a butoxy group, a pentyloxy group, a hexyloxy group, and a cyclohexyloxy group. Examples of the halogen atom include a fluorine atom, a chlorine atom, and a bromine atom.

Among them, in view of obtaining the resin containing phenolic hydroxyl groups having excellent balance between the developability, the heat resistance, and the substrate followability, it is preferable that l is an integer of 2 to 4, two $R^2$'s are an alkyl group having 1 to 3 carbon atoms, and other $R^2$'s each are a hydrogen atom or an aliphatic hydrocarbon group having 9 to 24 carbon atoms. In addition, it is preferable that two of the $R^2$'s which each are an alkyl group having 1 to 3 carbon atoms are bonded to 2- and 5-positions with respect to the phenolic hydroxyl group.

$R^3$ in Structural Formulae (2) and (3) is any one of a hydrogen atom, an aliphatic hydrocarbon group, an aromatic ring-containing hydrocarbon group, an alkoxy group, and a halogen atom. The aliphatic hydrocarbon group may be either a linear type or a branched type, and may be either a group having an unsaturated group in the structure or a group having no unsaturated group in the structure. The number of carbon atoms thereof is not particularly limited, and may be either a short chain having 1 to 6 carbon atoms or a relatively long chain having 7 or more carbon atoms. The aromatic ring-containing hydrocarbon group is not particularly limited as long as it is a structural moiety containing an aromatic ring, and examples thereof include an aralkyl group such as a benzyl group, a phenylethyl group, a phenylpropyl group, and a naphthylmethyl group in addition to an aryl group such as a phenyl group, a tolyl group, a xylyl group, a naphthyl group, and an anthryl group. Examples of the alkoxy group include a methoxy group, an ethoxy group, a propyloxy group, a butoxy group, a pentyloxy group, a hexyloxy group, and a cyclohexyloxy group. Examples of the halogen atom include a fluorine atom, a chlorine atom, and a bromine atom. Among them, in view of obtaining the resin containing phenolic hydroxyl groups excellent in balance between the developability, the heat resistance, and the substrate followability, $R^3$ is preferably a hydrogen atom or an aliphatic hydrocarbon group having 9 to 24 carbon atoms.

In the resin containing phenolic hydroxyl groups of the present invention represented by Structural Formula (1), at least one of $R^2$ and $R^3$ present in the resin is an aliphatic hydrocarbon group having 9 to 24 carbon atoms. As for a presence ratio of the aliphatic hydrocarbon group having 9 to 24 carbon atoms, in view of obtaining the resin containing phenolic hydroxyl groups excellent in balance between the developability, the heat resistance, and the substrate followability, the aliphatic hydrocarbon group having 9 to 24 carbon atoms is preferably in a range of 0.01 to 1 mol with respect to 1 mol of hydrogen group of the resin containing phenolic hydroxyl group.

In addition, the aliphatic hydrocarbon group having 9 to 24 carbon atoms is more preferably an aliphatic hydrocarbon group having 10 to 20 carbon atoms in view of obtaining resin containing phenolic hydroxyl groups which is particularly excellent in the substrate followability.

A method of producing the resin containing phenolic hydroxyl groups of the present invention is not particularly limited, and for example, the resin containing phenolic hydroxyl groups can be produced by a method of reacting a novolac resin intermediate obtained by reacting a triarylmethane compound (A) having a molecular structure represented by Structural Formula (4) or (5) with an aldehyde compound (B) as essential components, with an alkene compound (C) having 9 to 24 carbon atoms.

[Chem. 10]

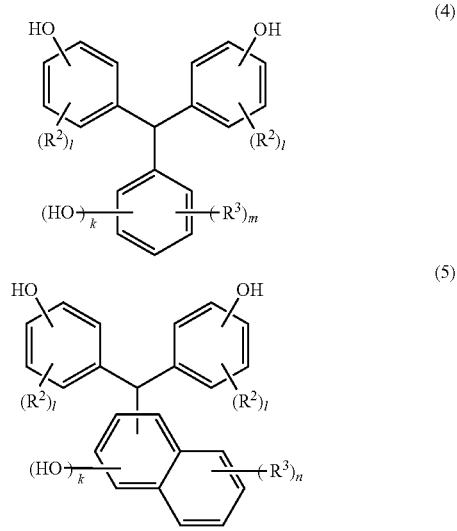

(In the formulae, k is any one of 0, 1, and 2. $R^2$'s each independently represent any one of a hydrogen atom, an aliphatic hydrocarbon group, an aromatic ring-containing hydrocarbon group, an alkoxy group, and a halogen atom, and l's are each independently an integer of 1 to 4. $R^3$ represents any one of a hydrogen atom, an aliphatic hydrocarbon group, an aromatic ring-containing hydrocarbon group, an alkoxy group, and a halogen atom, m is an integer of 1 to 4, and n is an integer of 1 to 6.)

With respect to the triarylmethane compound (A), a single compound having the same structure may be used or a plurality of compounds having different molecular structures may be used in combination. Among these, in view of obtaining the resin containing phenolic hydroxyl groups excellent in balance between the developability, the heat resistance, and the substrate followability, those having a molecular structure represented by Structural Formula (4) are preferable. Also, 20 mol % or more of the triarylmethane compound (A) is preferably a compound in which a value of k is 1. In the case where the value of k is 1, in Structural Formula (4), a bonding position of each of the three phenolic hydroxyl groups in the molecular structure is preferably a para position with respect to a methine group linking three aromatic rings.

Examples of the triarylmethane compound (A) include those obtained by a condensation reaction between a phenol compound (a1) and an aromatic aldehyde compound (a2). Examples of the phenol compound (a1) include phenol or compounds in which one or more hydrogen atoms on the aromatic nucleus of phenol are substituted with an alkyl group, an alkoxy group, a halogen atom, or the like. Each of these may be used alone, or two or more kinds thereof may be used in combination. Among them, in view of obtaining a resin containing phenolic hydroxyl groups excellent in the heat resistance, a compound having a substituent of anyone of an alkyl group, an aryl group, and an aralkyl group at 2- and 5-positions of phenol is preferable, a compound having a substituent of any one of a methyl group, an ethyl group, and a propyl group at 2- and 5-positions is preferable, and 2,5-xylenol is particularly preferable.

Examples of the aromatic aldehyde compound (a2) include a compound having a formyl group on an aromatic nucleus such as benzene, naphthalene, phenol, resorcin, naphthol, or dihydroxynaphthalene, and optionally having an alkyl group, an alkoxy group, a halogen atom or the like besides a formyl group. These may be used alone, or two or more kinds thereof may be used in combination. Among them, in view of obtaining the resin containing phenolic hydroxyl groups excellent in balance between the developability, the heat resistance, those having a benzene ring structure are preferable. Specifically, benzaldehyde, salicylaldehyde, m-hydroxybenzaldehyde, p-hydroxybenzaldehyde are preferable.

The reaction molar ratio [(a)/(b)] between the phenol compound (a1) and the aromatic aldehyde compound (a2) is preferably in a range of 1/0.2 to 1/0.5, and is more preferably in a range of 1/0.25 to 1/0.45 in view of obtaining the desired triarylmethane compound (A) at a high yield and high purity.

The reaction between the phenol compound (a1) and the aromatic aldehyde compound (a2) is preferably carried out under the acid catalyst condition. Examples of the acid catalyst used here include acetic acid, oxalic acid, sulfuric acid, hydrochloric acid, phenolsulfonic acid, p-toluenesulfonic acid, zinc acetate, and manganese acetate. Each of these acid catalysts may be used singly, or two or more kinds thereof may be used in combination. Among these, from the viewpoint of excellent catalytic activity, sulfuric acid and p-toluenesulfonic acid are preferable.

The reaction between the phenol compound (a1) and the aromatic aldehyde compound (a2) may be carried out in an organic solvent as necessary. Examples of the solvent used here include a monoalcohol such as methanol, ethanol, and propanol; a polyol such as ethylene glycol, 1,2-propanediol, 1,3-propanediol, 1,4-butanediol, 1,5-pentanediol, 1,6-hexanediol, 1,7-heptanediol, 1,8-octanediol, 1,9-nonanediol, trimethylene glycol, diethylene glycol, polyethylene glycol, and glycerin; a glycol ether such as 2-ethoxyethanol, ethylene glycol monomethyl ether, ethylene glycol monoethyl ether, ethylene glycol monopropyl ether, ethylene glycol monobutyl ether, ethylene glycol monopentyl ether, ethylene glycol dimethyl ether, ethylene glycol ethyl methyl ether, and ethylene glycol monophenyl ether; a cyclic ether such as 1,3-dioxane, 1,4-dioxane, and tetrahydrofuran; a glycol ester such as ethylene glycol acetate; a ketone such as acetone, methyl ethyl ketone, and methyl isobutyl ketone. Each of these solvents may be used singly, or two or more kinds thereof may be used together as a mixed solvent.

The reaction between the phenol compound (a1) and the aromatic aldehyde compound (a2) may be carried out, for example, at 60° C. to 140° C. for 0.5 to 20 hours.

After the end of the reaction, the unreacted phenol compound (a1) or the aromatic aldehyde compound (a2) and the acid catalyst used are removed from the reaction product, for example, by the method in which the reaction product is put into a poor solvent (S1) for the triarylmethane compound (A), a precipitate is isolated by filtration, and then the obtained precipitate is redissolved in a solvent (S2) of which solubility for the triarylmethane compound (A) is high and which is miscible with the poor solvent (S1), thereby obtaining the purified triarylmethane compound (A).

In the case where the reaction between the phenol compound (a1) and the aromatic aldehyde compound (a2) is carried out in an aromatic hydrocarbon solvent such as toluene and xylene, the reaction product is heated at 80° C. or higher to dissolve the triarylmethane compound (A) in the aromatic hydrocarbon solvent and cooled as it is, and thereby the crystals of the triarylmethane compound (A) can be precipitated.

Examples of the poor solvent (S1) used for the purification of the triarylmethane compound (A) include water; a monoalcohol such as methanol, ethanol, propanol, and ethoxyethanol; an aliphatic hydrocarbon such as n-hexane, n-heptane, n-octane, and cyclohexane; and an aromatic hydrocarbon such as toluene and xylene. These solvents may be used singly, or two or more kinds thereof may be used in combination. Among these, in view of excellent solubility of the acid catalyst, water, methanol, and ethoxyethanol are preferable.

Examples of the solvent (S2) include a monoalcohol such as methanol, ethanol, and propanol; a polyol such as ethylene glycol, 1,2-propanediol, 1,3-propanediol, 1,4-butanediol, 1,5-pentanediol, 1,6-hexanediol, 1,7-heptanediol, 1,8-octanediol, 1,9-nonanediol, trimethylene glycol, diethylene glycol, polyethylene glycol, and glycerin; a glycol ether such as 2-ethoxyethanol, ethylene glycol monomethyl ether, ethylene glycol monoethyl ether, ethylene glycol monopropyl ether, ethylene glycol monobutyl ether, ethylene glycol monopentyl ether, ethylene glycol dimethyl ether, ethylene glycol ethyl methyl ether, and ethylene glycol monophenyl ether; a cyclic ether such as 1,3-dioxane and 1,4-dioxane; a glycol ester such as ethylene glycol acetate; and a ketone such as acetone, methyl ethyl ketone, and methyl isobutyl ketone. Each of these solvents may be used singly, or two or more kinds thereof may be used in combination. Among these, in the case where water or a monoalcohol is used as the poor solvent (S1), it is preferable that acetone is used as the solvent (S2).

The aldehyde compound (B) is not limited as long as it is capable of forming a novolac-type resin containing phenolic hydroxyl groups by a condensation reaction with the triarylmethane compound (A), and examples thereof include formaldehyde, paraformaldehyde, 1,3,5-trioxane, acetaldehyde, propionaldehyde, tetraoxymethylene, polyoxymethylene, chloral, hexamethylenetetramine, furfural, glyoxal, n-butyraldehyde, caproaldehyde, allylaldehyde, crotonaldehyde, and acrolein. These may be used alone, or two or more kinds thereof may be used in combination. Among them, in view of excellent reactivity, formaldehyde is preferably used. The formaldehyde may be used as formalin in the form of an aqueous solution or may be used as paraformaldehyde in a solid state. Further, in the case where the formaldehyde and other aldehyde compounds are used in combination, it is preferable to use other aldehyde compounds in an amount of 0.05 to 1 mol per 1 mol of formaldehyde.

The novolac resin intermediate may be one obtained by reacting the triarylmethane compound (A) with the aldehyde compound (B) and other phenolic hydroxyl group-containing compound (A'). Examples of the other phenolic hydroxyl group-containing compound (A') used here include phenol, phenyl phenol, bisphenol, dihydroxybenzene, naphthol, and dihydroxynaphthalene. Each of these may be used alone, or two or more types thereof may be used in combination.

The reaction molar ratio [(A)/(B)] between the triarylmethane compound (A) and the aldehyde compound (B) is preferably in the range of 1/0.5 to 1/1.2, and more preferably in the range of 1/0.6 to 1/0.9, in view of suppressing the excessive increase in molecular weight (gelation) and providing a novolac-type resin containing phenolic hydroxyl groups having an appropriate molecular weight for a resist composition.

In the case where the triarylmethane compound (A) and other phenolic hydroxyl group-containing compound (A') are used in combination, the reaction molar ratio [(A+A')/(B)] of the sum of these compounds to the aldehyde compound (B) is preferably in a range of 1/0.5 to 1/1.2, and more preferably in the range of 1/0.6 to 1/0.9.

The reaction between the triarylmethane compound (A) and the aldehyde compound (B) is preferably carried out under acid catalyst conditions. Examples of the acid catalyst used here include acetic acid, oxalic acid, sulfuric acid, hydrochloric acid, phenolsulfonic acid, p-toluenesulfonic acid, zinc acetate, and manganese acetate. Each of these acid catalysts may be used singly, and two or more kinds thereof may be used in combination. Among these, from the viewpoint of excellent catalytic activity, sulfuric acid and p-toluenesulfonic acid are preferable.

The reaction between the triarylmethane compound (A) and the aldehyde compound (B) may be carried out in an organic solvent as necessary. Examples of the solvent used here include a monoalcohol such as methanol, ethanol, and propanol; a polyol such as ethylene glycol, 1,2-propanediol, 1,3-propanediol, 1,4-butanediol, 1,5-pentanediol, 1,6-hexanediol, 1,7-heptanediol, 1,8-octanediol, 1,9-nonanediol, trimethylene glycol, diethylene glycol, polyethylene glycol, and glycerin; a glycol ether such as 2-ethoxyethanol, ethylene glycol monomethyl ether, ethylene glycol monoethyl ether, ethylene glycol monopropyl ether, ethylene glycol monobutyl ether, ethylene glycol monopentyl ether, ethylene glycol dimethyl ether, ethylene glycol ethyl methyl ether, and ethylene glycol monophenyl ether; a cyclic ether such as 1,3-dioxane, 1,4-dioxane, and tetrahydrofuran; a glycol ester such as ethylene glycol acetate; and a ketone such as acetone, methyl ethyl ketone, and methyl isobutyl ketone. Each of these solvents may be used singly, or two or more kinds thereof may be used together as a mixed solvent.

The reaction between the triarylmethane compound (A) and the aldehyde compound (B) is carried out, for example, at 60° C. to 140° C. for 0.5 to 20 hours.

After the end of the reaction, a reprecipitation operation which is performed by adding water to the reaction product or other operations is carried out, thereby obtaining a novolac resin intermediate.

In view of obtaining the resin containing phenolic hydroxyl groups which is excellent in the balance between the developability, the heat resistance, and the substrate followability, and is suitable for a resist material, the weight average molecular weight (Mw) of the novolac resin intermediate obtained as described above is preferably 8,000 to 30,000. In addition, the polydispersity (Mw/Mn) of the resin containing phenolic hydroxyl groups is preferably 3 to 10.

Note that, the weight average molecular weight (Mw) and the polydispersity (Mw/Mn) in the present invention are the values measured by GPC under the following conditions.

[Measurement Condition for GPC]
Measurement device: "HLC-8220 GPC" manufactured by TOSOH CORPORATION
Column: "Shodex KF802" (8.0 mmφ×300 mm) manufactured by SHOWA DENKO K.K.
+"Shodex KF802" (8.0 mmφ×300 mm) manufactured by SHOWA DENKO K.K.
+"Shodex KF803" (8.0 mmφ×300 mm) manufactured by SHOWA DENKO K.K.
+"Shodex KF804" (8.0 mmφ×300 mm) manufactured by SHOWA DENKO K.K.
Column temperature: 40° C.
Detector: RI (differential refractometer)
Data processing: "GPC-8020 MODEL II VERSION 4.30" manufactured by TOSOH CORPORATION
Eluent: tetrahydrofuran
Flow rate: 1.0 mL/min
Sample: a sample obtained by filtering 0.5% by mass (in terms of a resin solid content) of tetrahydrofuran solution through a microfilter) (100 μl)
Standard sample: the following monodisperse polystyrene (Standard sample: monodisperse polystyrene)
"A-500" manufactured by TOSOH CORPORATION
"A-2500" manufactured by TOSOH CORPORATION
"A-5000" manufactured by TOSOH CORPORATION
"F-1" manufactured by TOSOH CORPORATION
"F-2" manufactured by TOSOH CORPORATION
"F-4" manufactured by TOSOH CORPORATION
"F-10" manufactured by TOSOH CORPORATION
"F-20" manufactured by TOSOH CORPORATION The molecular structure of the alkene compound (C) having 9 to 24 carbon atoms is not particularly limited as long as it has an ethylenic double bond site capable of reacting with the novolac resin intermediate, and for example, a compound represented by Structural Formula (6):

[Chem. 11]

(6)

(in the formula, $R^4$ is an aliphatic hydrocarbon group having 7 to 22 carbon atoms) is exemplified.

The alkene compound (C) having 9 to 24 carbon atoms may be used alone or two or more kinds thereof may be used in combination.

$R^4$ in Structural Formula (6) may be either a linear type or a branched type, and may be either a group having an unsaturated group in the structure or a group having no unsaturated group in the structure as long as it is an aliphatic hydrocarbon group having 7 to 22 carbon atoms. Among these, $R^4$ is preferably a linear alkyl group in view of obtaining the resin containing phenolic hydroxyl groups having particularly excellent substrate followability, and the number of carbon atoms thereof is particularly preferably in the range of 8 to 18.

Regarding the reaction ratio of the novolac resin intermediate to the alkene compound (C) having 9 to 24 carbon atoms, in view of obtaining the resin containing phenolic hydroxyl groups excellent in balance between the developability, the heat resistance, and the substrate followability, the alkene compound (C) having 9 to 24 carbon atoms is preferably 0.5% to 30% by mass with respect to the total mass of the novolac resin intermediate and the alkene compound (C) having 9 to 24 carbon atoms.

The reaction of the novolac resin intermediate with the alkene compound (C) having 9 to 24 carbon atoms is preferably carried out under the acid catalyst condition. Examples of the acid catalyst used here include acetic acid, oxalic acid, sulfuric acid, hydrochloric acid, phenolsulfonic acid, p-toluenesulfonic acid, zinc acetate, and manganese acetate. Each of these acid catalysts may be used singly, or two or more kinds thereof may be used in combination. Among these, from the viewpoint of excellent catalytic activity, sulfuric acid is preferable.

The reaction of the novolac resin intermediate with the alkene compound (C) having 9 to 24 carbon atoms may be carried out in an organic solvent as necessary. Examples of the solvent used here include a monoalcohol such as methanol, ethanol, and propanol; a polyol such as ethylene glycol, 1,2-propanediol, 1,3-propanediol, 1,4-butanediol, 1,5-pentanediol, 1,6-hexanediol, 1,7-heptanediol, 1,8-octanediol, 1,9-nonanediol, trimethylene glycol, diethylene glycol, polyethylene glycol, and glycerin; a glycol ether such as 2-ethoxyethanol, ethylene glycol monomethyl ether, ethylene glycol monoethyl ether, ethylene glycol monopropyl ether, ethylene glycol monobutyl ether, ethylene glycol monopentyl ether, ethylene glycol dimethyl ether, ethylene glycol ethyl methyl ether, and ethylene glycol monophenyl ether; a cyclic ether such as 1,3-dioxane, 1,4-dioxane, and tetrahydrofuran; a glycol ester such as ethylene glycol acetate; a ketone such as acetone, methyl ethyl ketone, and methyl isobutyl ketone. Each of these solvents may be used singly, or two or more kinds thereof may be used together as a mixed solvent.

The reaction of the novolac resin intermediate with the alkene compound (C) having 9 to 24 carbon atoms is carried out, for example, at a temperature range of 60° C. to 140° C. for 0.5 to 20 hours.

After the end of the reaction, for example, a reprecipitation operation is performed by adding water to the reaction product and washing is performed with an appropriate organic solvent, thereby obtaining the desired resin containing phenolic hydroxyl group. In view of exhibiting excellent balance among developability, heat resistance, and substrate followability, and suitability as a resist material, the weight average molecular weight (Mw) of the resin containing phenolic hydroxyl groups obtained as described above is preferably 8,000 to 30,000. In addition, the polydispersity (Mw/Mn) of the resin containing phenolic hydroxyl groups is preferably 3 to 10.

In view of excellent solubility in a general-purpose organic solvent and resistance to thermal decomposition, the resin containing phenolic hydroxyl groups of the present invention described above in detail can be used for various electrical and electronic members such as an adhesive or paint, a photoresist, and a printed wiring board. Further, since the resin containing phenolic hydroxyl groups of the present invention is excellent in alkali solubility, it is particularly suitable for resist application, and is capable of providing a resist material excellent in photosensitivity and resolution. Further, the resin containing phenolic hydroxyl groups of the present invention is excellent in the heat resistance and the flexibility in addition to the developability, and also exhibits high toughness also in a cured product reacted with a curing agent, so that it can also be suitably used for thick film applications, resist underlayer films, resist permanent film applications. For example, even at the time of forming a thick film, as well as an ordinary resist film, a sufficiently fine resist pattern can be formed, which has a feature of being highly flexible and hardly causing cracks and the like. Furthermore, in the case of being used for an underlayer film or a permanent film, it has a feature of being excellent in the substrate followability, and hardly causing deterioration or alteration due to a heat treatment step at the time of semiconductor manufacturing.

A photosensitive composition of the present invention includes the resin containing phenolic hydroxyl groups of the present invention and a photosensitizing agent as essential components. In the photosensitive composition of the present invention, a resin (D) other than the resin containing phenolic hydroxyl groups of the present invention may be used together with the above components. As the other resin (D), any resin can be used as long as the resin is soluble in an alkali developer or can be dissolved in an alkali developer by being used in combination with an additive such as an acid generator.

Examples of the other resin (D) used here include a phenol resin (D-1) other than the resin containing phenolic hydroxyl groups, a homopolymer or a copolymer (D-2) of a hydroxyl group-containing styrene compound such as p-hydroxystyrene and p-(1,1,1,3,3,3-hexafluoro-2-hydroxypropyl)styrene, a resin (D-3) obtained by modifying a hydroxyl group of (D-1) or (D-2) with an acid decomposable group such as a t-butoxycarbonyl group and a benzyloxycarbonyl group, a homopolymer or a copolymer (D-4) of (meth) acrylic acid, an alternating polymer (D-5) of an alicyclic polymerizable monomer such as a norbornene compound or a tetracyclododecene compound, and maleic anhydride or maleimide, and the like.

Examples of the other phenol resin (D-1) include phenol resins such as a phenol novolac resin, a cresol novolac resin, a naphthol novolac resin, a co-condensed novolac resin obtained by using various phenolic compounds, an aromatic hydrocarbon formaldehyde resin-modified phenol resin, a dicyclopentadiene phenol adduct resin, a phenol aralkyl resin (XYLOK resin), a naphthol aralkyl resin, a trimethylolmethane resin, a tetraphenylolethane resin, a biphenyl-modified phenol resin (a polyhydric phenol compound in which phenol nuclei are linked by a bismethylene group), a biphenyl-modified naphthol resin (a polyhydric naphthol compound in which phenol nuclei are linked by a bismethylene group), an aminotriazine-modified phenol resin (a polyhydric phenol compound in which phenol nuclei are linked by melamine, benzoguanamine, or the like), and an alkoxy group-containing aromatic ring-modified novolac resin (a polyhydric phenol compound in which a phenol nucleus is linked with an alkoxy group-containing aromatic ring by formaldehyde).

Among the other phenol resins (D), in view of obtaining a photosensitive resin composition having high sensitivity and excellent heat resistance, a cresol novolac resin or a co-condensed novolac resin of cresol and another phenolic compound is preferable. The cresol novolac resin or the co-condensed novolac resin of cresol and another phenolic compound is specifically a novolac resin obtained by using at least one cresol selected from the group consisting of o-cresol, m-cresol, and p-cresol and an aldehyde compound as essential raw materials and optionally other suitable phenolic compounds in combination.

Examples of the other phenolic compound than the cresol include phenol; xylenol such as 2,3-xylenol, 2,4-xylenol, 2,5-xylenol, 2,6-xylenol, 3,4-xylenol, and 3,5-xylenol; ethylphenol such as o-ethylphenol, m-ethylphenol, and p-ethylphenol; butylphenol such as isopropylphenol, butylphenol, and p-t-butylphenol; alkylphenol such as p-pentylphenol, p-octylphenol, p-nonylphenol, and p-cumylphenol; halogenated phenol such as fluorophenol, chlorophenol, bromophenol, and iodophenol; monosubstituted phenol such as p-phenylphenol, aminophenol, nitrophenol, dinitrophenol, and trinitrophenol; fused polycyclic phenol such as 1-naphthol and 2-naphthol; and polyhydric phenol such as resorcin, alkyl resorcin, pyrogallol, catechol, alkyl catechol, hydroquinone, alkyl hydroquinone, phloroglucin, bisphenol A, bisphenol F, bisphenol S, and dihydroxynaphthalene. These other phenolic compounds may be used singly, or two or more kinds thereof may be used in combination. In the case where these other phenolic compounds are used, the amount of the compounds used is preferably set such that the number of moles of the other phenolic compounds is 0.05 to 1 mol with respect to the total of 1 mol of the cresol raw material.

Furthermore, examples of the aldehyde compound include formaldehyde, paraformaldehyde, trioxane, acetaldehyde, propionaldehyde, polyoxymethylene, chloral, hexamethylenetetramine, furfural, glyoxal, n-butyl aldehyde, caproaldehyde, allyl aldehyde, benzaldehyde, crotonaldehyde, acrolein, tetraoxymethylene, phenylacetaldehyde, o-tolualdehyde, and salicylaldehyde, and each of these aldehyde compounds may be used singly, or two or more kinds thereof may be used in combination. Among these, in view of excellent reactivity, formaldehyde is preferable, and formaldehyde may be used in combination with another aldehyde compound. In the case where formaldehyde is used in combination with another aldehyde compound, the amount of another aldehyde compound used is preferably 0.05 to 1 mol with respect to 1 mol of formaldehyde.

In view of obtaining the photosensitive resin composition having excellent sensitivity and heat resistance, the reaction ratio between the phenolic compound and the aldehyde compound when producing a novolac resin is set such that the number of moles of the aldehyde compound is preferably 0.3 to 1.6 mol and more preferably 0.5 to 1.3 with respect to 1 mol of the phenolic compound.

Examples of the method for the reaction between the phenolic compound and the aldehyde compound include a method in which the reaction is carried out under the temperature condition of 60° C. to 140° C. in the presence of an acid catalyst and then water and residual monomers are removed under the condition of reduced pressure. Examples of the acid catalyst used here include oxalic acid, sulfuric acid, hydrochloric acid, phenolsulfonic acid, p-toluenesulfonic acid, zinc acetate, and manganese acetate, and each of these acid catalysts may be used singly, or two or more kinds thereof may be used in combination. Among these, from the viewpoint of excellent catalytic activity, oxalic acid is preferable.

Among the cresol novolac resin or the co-condensed novolac resin of cresol and another phenolic compound described above in detail, a cresol novolac resin obtained by solely using m-cresol or a cresol novolac resin obtained by using m-cresol and p-cresol together is preferable. In the latter case, the reaction molar ratio between m-cresol and p-cresol [m-cresol/p-cresol] is preferably 10/0 to 2/8 and more preferably 7/3 to 2/8, in view of obtaining the photosensitive resin composition having excellent balance between sensitivity and heat resistance.

In the case where the other resin (D) is used, the blending ratio between the resin containing phenolic hydroxyl groups of the present invention and the other resin (D) can be optionally adjusted according to the desired use. For example, since optical sensitivity, resolution, and heat resistance of the resin containing phenolic hydroxyl groups of the present invention are excellent when the resin is used in combination with the photosensitizing agent, the photosensitive composition including the resin containing phenolic hydroxyl groups of the present invention and the photosensitizing agent as the main components is optimal for use in a resist. Here, in view of obtaining a curable composition having high optical sensitivity and excellent resolution and heat resistance, the proportion of the resin containing phenolic hydroxyl groups of the present invention in the total resin components is preferably 60% by mass or higher and more preferably 80% by mass or higher.

The resin containing phenolic hydroxyl groups of the present invention can be used as a sensitivity improving agent by making use of the characteristic of excellent optical sensitivity of the resin. In this case, the blending ratio between the resin containing phenolic hydroxyl groups and the other resin (D) is preferably set such that the amount of the resin containing phenolic hydroxyl groups of the present invention is 3 to 80 parts by mass with respect to 100 parts by mass of the other resin (D).

Examples of the photosensitizing agent include a compound having a quinone diazide group. Specific examples of the compound having a quinone diazide group include a complete ester compound, a partial ester compound, an amidated product, or a partial amidated product of an aromatic (poly)hydroxy compound and sulfonic acid having a quinone diazide group such as naphthoquinone-1,2-diazide-5-sulfonic acid, naphthoquinone-1,2-diazide-4-sulfonic acid, and ortho-anthraquinone diazide sulfonic acid.

Examples of the aromatic (poly)hydroxy compound used here include a polyhydroxybenzophenone compound such as 2,3,4-trihydroxybenzophenone, 2,4,4'-trihydroxybenzophenone, 2,4,6-trihydroxybenzophenone, 2,3,6-trihydroxybenzophenone, 2,3,4-trihydroxy-2'-methylbenzophenone, 2,3,4,4'-tetrahydroxybenzophenone, 2,2',4,4'-tetrahydroxybenzophenone, 2,3',4,4',6-pentahydroxybenzophenone, 2,2',3,4,4'-pentahydroxybenzophenone, 2,2',3,4,5-pentahydroxybenzophenone, 2,3',4,4',5',6-hexahydroxybenzophenone, and 2,3,3',4,4',5'-hexahydroxybenzophenone;

a bis[(poly)hydroxyphenyl]alkane compound such as bis(2,4-dihydroxyphenyl)methane, bis(2,3,4-trihydroxyphenyl)methane, 2-(4-hydroxyphenyl)-2-(4'-hydroxyphenyl)propane, 2-(2,4-dihydroxyphenyl)-2-(2',4'-dihydroxyphenyl)propane, 2-(2,3,4-trihydroxyphenyl)-2-(2',3',4'-trihydroxyphenyl)propane, 4,4'-{1-[4-[2-(4-hydroxyphenyl)-2-propyl]phenyl]ethylidene}bisphenol, and 3,3'-dimethyl-{1-[4-[2-(3-methyl-4-hydroxyphenyl)-2-propyl]phenyl]ethylidene}bisphenol;

a tris(hydroxyphenyl)methane compound such as tris(4-hydroxyphenyl)methane, bis(4-hydroxy-3,5-dimethylphenyl)-4-hydroxyphenylmethane, bis(4-hydroxy-2,5-dimethylphenyl)-4-hydroxyphenylmethane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-2,5-dimethylphenyl)-3,4-dihydroxyphenylmethane, and bis(4-hydroxy-3,5-dimethylphenyl)-3,4-dihydroxyphenylmethane or a methyl substitution product thereof;

and a bis(cyclohexylhydroxyphenyl)(hydroxyphenyl)methane compound such as bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(5-cyclohexyl-4-hydroxy-2-methylphenyl)-2-hydroxyphenyl methane, bis(5-cyclohexyl-4-hydroxy-2-methylphenyl)-3-hydroxyphenyl methane, bis(5-cyclohexyl-4-hydroxy-2-methylphenyl)-4-hydroxyphenyl methane, bis(3-cyclohexyl-2-hydroxyphenyl)-3-hydroxyphenylmethane, bis(5-cyclohexyl-4-hydroxy-3-methylphenyl)-4-hydroxyphenyl methane, bis(5-cyclohexyl-4-hydroxy-3-methylphenyl)-3-hydroxyphenyl methane, bis(5-cyclohexyl-4-hydroxy-3-methylphenyl)-2-hydroxyphenyl methane, bis(3-cyclohexyl-2-hydroxyphenyl)-4-hydroxyphenylmethane, bis(3-cyclohexyl-2-hydroxyphenyl)-2-hydroxyphenylmethane, bis(5-cyclohexyl-2-hydroxy-4-methylphenyl)-2-hydroxyphenyl methane, and bis(5-cyclohexyl-2-hydroxy-4-methylphenyl)-4-hydroxyphenyl methane or a methyl substitution product thereof. Each of these photosensitizing agents may be used singly, or two or more kinds thereof may be used in combination.

In view of obtaining the photosensitive composition having excellent optical sensitivity, the blending amount of the photosensitizing agent in the photosensitive composition of the present invention is preferably 5 to 50 parts by mass with respect to 100 parts by mass of the total of the resin solid contents in the photosensitive composition.

The photosensitive composition of the present invention may include a surfactant, for example, for the purpose of improving film forming properties and adhesiveness of a pattern and reducing development defects in the case of using the composition for a resist. Examples of the surfactant used here include a nonionic surfactant such as a polyoxyethylene alkyl ether compound such as polyoxyethylene lauryl ether, polyoxyethylene stearyl ether, polyoxyethylene cetyl ether, and polyoxyethylene oleyl ether, a polyoxyethylene alkyl allyl ether compound such as polyoxyethylene octylphenol ether, and polyoxyethylene nonylphenol ether, a sorbitan fatty acid ester compound such as polyoxyethylene-polyoxypropylene block copolymer, sorbitan monolaurate, sorbitan monopalmitate, sorbitan monostearate, sorbitan monooleate, sorbitan trioleate, and sorbitan tristearate, and a polyoxyethylene sorbitan fatty acid ester compound such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; a fluorine-based surfactant having a fluorine atom in the molecular structure thereof such as a copolymer of a polymerizable monomer having a fluoroaliphatic group and [poly(oxyalkylene)](meth)acrylate; and a silicone-based surfactant having a silicone structural moiety in the molecular structure thereof. These surfactants may be used singly, or two or more kinds thereof may be used in combination.

The blending amount of the surfactant is preferably 0.001 to 2 parts by mass with respect to 100 parts by mass of the total of the resin solid contents in the photosensitive composition of the present invention.

In the case where the photosensitive composition of the present invention is used for a photoresist, the composition can be used as a composition for a resist by adding the resin containing phenolic hydroxyl groups of the present invention, the photosensitizing agent, and, as necessary, the other resin (D), and various additives such as a surfactant, a dye, a filler, a crosslinking agent, and a dissolution promotor, and dissolving the above components in an organic solvent. This may be used as a positive tone resist solution as it is, or the composition may be utilized as a positive tone resist film formed by applying the composition in a film shape and removing the solvent. Examples of a support film when used as the resist film include a synthetic resin film such as polyethylene, polypropylene, polycarbonate, and polyethylene terephthalate, and the film may be used as a single layer film or a plurality of multilayer films. The surface of the support film may be subjected to a corona treatment or may be coated with a release agent.

The organic solvent used for the composition for a resist of the present invention is not particularly limited, and examples thereof include alkylene glycol monoalkyl ether such as ethylene glycol monomethyl ether, ethylene glycol monoethyl ether, ethylene glycol monopropyl ether, ethylene glycol monobutyl ether, and propylene glycol monomethyl ether; dialkylene glycol dialkyl ether such as diethylene glycol dimethyl ether, diethylene glycol diethyl ether, diethylene glycol dipropyl ether, and diethylene glycol dibutyl ether; alkylene glycol alkyl ether acetate such as ethylene glycol monomethyl ether acetate, ethylene glycol monoethyl ether acetate, and propylene glycol monomethyl ether acetate; a ketone compound such as acetone, methyl ethyl ketone, cyclohexanone, and methyl amyl ketone; a cyclic ether such as dioxane; and an ester compound such as methyl 2-hydroxypropionate, ethyl 2-hydroxypropionate, ethyl 2-hydroxy-2-methylpropionate, ethyl ethoxyacetate, ethyl oxyacetate, methyl 2-hydroxy-3-methylbutanoate, 3-methoxybutyl acetate, 3-methyl-3-methoxybutyl acetate, ethyl formate, ethyl acetate, butyl acetate, methyl acetoacetate, and ethyl acetoacetate. Each of these organic solvents may be used singly, or two or more kinds thereof may be used in combination.

The composition for a resist of the present invention can be prepared by blending each of the components and mixing with a stirrer or the like. In the case where a resin composition for a photoresist includes a filler or a pigment, the composition can be prepared by dispersing or mixing the components with a dispersing device such as a dissolver, a homogenizer, and a three roll mill.

In a photolithography method using the composition for a resist of the present invention, for example, an object to be subjected to photolithography, such as silicon substrate, is coated with the composition for a resist, and prebaking is performed under a temperature condition of 60° C. to 150° C. A coating method used here may be any method such as spin coating, roll coating, flow coating, dip coating, spray coating, and doctor blade coating. Next, a resist pattern is created, however, since the composition for a resist of the present invention is a positive-tone resist composition, a resist pattern is formed by performing exposure through a prescribed mask to provide a desired resist pattern and dissolving the exposed portion with an alkali developer. In the composition for a resist of the present invention, both alkali solubility of the exposed portion and alkali insolubility of the unexposed portion are high, and thus, it is possible to form a resist pattern with excellent resolution.

The curable composition of the present invention includes the resin containing phenolic hydroxyl groups of the present invention and a curing agent as essential components. In the curable composition of the present invention, a resin (E) other than the resin containing phenolic hydroxyl groups of the present invention may be used together with the above components. Examples of the other resin (E) used here include various novolac resins, a resin formed by addition polymerization of an alicyclic diene compound such as dicyclopentadiene and a phenol compound, a modified novolac resin of a phenolic hydroxyl group-containing compound and an alkoxy group-containing aromatic compound, a phenol aralkyl resin (XYLOK resin), a naphthol aralkyl resin, a trimethylolmethane resin, a tetraphenylolethane resin, a biphenyl-modified phenol resin, a biphenyl-modified naphthol resin, an aminotriazine-modified phenol resin, and various vinyl polymers.

More specifically, examples of the various novolac resins include a polymer obtained by reacting a phenolic hydroxyl group-containing compound, for example, phenol, alkylphenol such as cresol and xylenol, phenylphenol, resorcinol, biphenyl, bisphenol such as bisphenol A and bisphenol F, naphthol, and dihydroxynaphthalene with an aldehyde compound, under the condition of an acid catalyst.

Examples of the various vinyl polymer include a homopolymer or a copolymer of vinyl compounds such as polyhydroxystyrene, polystyrene, polyvinyl naphthalene, polyvinyl anthracene, polyvinyl carbazole, polyindene, polyacenaphthylene, polynorbornene, polycyclodecene, polytetracyclododecene, polynortricyclene, and poly(meth)acrylate.

In the case where these other resins are used, the blending ratio between the resin containing phenolic hydroxyl groups of the present invention and the other resin (E) can be optionally set according to the use, however, in view of more remarkably expressing the effect of excellent dry etching resistance and resistance to thermal decomposition exhibited by the present invention, the blending ratio is preferably set such that the amount of the other resin (E) is 0.5 to 100 parts by mass with respect to 100 parts by mass of the resin containing phenolic hydroxyl groups of the present invention.

Examples of the curing agent used in the present invention include a melamine compound substituted with at least one group selected from the group consisting of a methylol group, an alkoxymethyl group, and an acyloxymethyl group, a guanamine compound, a glycoluril compound, a urea compound, a resole resin, an epoxy compound, an isocyanate compound, an azide compound, a compound containing a double bond such as an alkenyl ether group, an acid anhydride, and an oxazoline compound.

Examples of the melamine compound include hexamethylol melamine, hexamethoxymethyl melamine, a compound in which one to six methylol groups of hexamethylol melamine are methoxy methylated, hexamethoxyethyl melamine, hexaacyloxymethyl melamine, and a compound in which one to six methylol groups of hexamethylol melamine are acyloxymethylated.

Examples of the guanamine compound include tetramethylol guanamine, tetramethoxymethyl guanamine, tetramethoxymethyl benzoguanamine, a compound in which one to four methylol groups of tetramethylol guanamine are methoxy methylated, tetramethoxyethyl guanamine, tetraacyloxy guanamine, and a compound in which one to four methylol groups of tetramethylol guanamine are acyloxymethylated.

Examples of the glycoluril compound include 1,3,4,6-tetrakis(methoxymethyl)glycoluril, 1,3,4,6-tetrakis(butoxymethyl)glycoluril, and 1,3,4,6-tetrakis(hydroxymethyl) glycoluril.

Examples of the urea compound include 1,3-bis(hydroxymethyl)urea, 1,1,3,3-tetrakis(butoxymethyl)urea, and 1,1,3,3-tetrakis(methoxymethyl)urea.

Examples of the resol resin include a polymer obtained by reacting a phenolic hydroxyl group-containing compound, for example, phenol, alkylphenol such as cresol and xylenol, phenylphenol, resorcinol, biphenyl, bisphenol such as bisphenol A and bisphenol F, naphthol, and dihydroxynaphthalene with an aldehyde compound under the condition of an alkali catalyst.

Examples of the epoxy compound include diglycidyloxynaphthalene, a phenol novolac-type epoxy resin, a cresol novolac-type epoxy resin, a naphthol novolac-type epoxy resin, a naphthol-phenol co-condensed novolac-type epoxy resin, a naphthol-cresol co-condensed novolac-type epoxy resin, a phenol aralkyl-type epoxy resin, a naphthol aralkyl-type epoxy resin, 1,1-bis(2,7-diglycidyloxy-1-naphthyl)alkane, a naphthylene ether-type epoxy resin, a triphenyl methane-type epoxy resin, a dicyclopentadiene-phenol addition reaction-type epoxy resin, a phosphorus atom-containing epoxy resin, and a polyglycidyl ether of a co-condensate of a phenolic hydroxyl group-containing compound and an alkoxy group-containing aromatic compound.

Examples of the isocyanate compound include tolylene diisocyanate, diphenylmethane diisocyanate, hexamethylene diisocyanate, and cyclohexane diisocyanate.

Examples of the azide compound include 1,1'-biphenyl-4,4'-bis azide, 4,4'-methylidene bis azide, and 4,4'-oxy bis azide.

Examples of the compound containing a double bond such as an alkenyl ether group include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

Examples of the acid anhydride include an aromatic acid anhydride such as phthalic anhydride, trimellitic anhydride, pyromellitic anhydride, 3,3',4,4'-benzophenonetetracarboxylic dianhydride, biphenyltetracarboxylic dianhydride, 4,4'-(isopropylidene)diphthalic anhydride, and 4,4'-(hexafluoroisopropylidene)diphthalic anhydride; and an alicyclic carboxylic anhydride such as tetrahydrophthalic anhydride, methyltetrahydrophthalic anhydride, hexahydrophthalic anhydride, methylhexahydrophthalic anhydride, endomethylenetetrahydrophthalic anhydride, dodecenylsuccinic anhydride, and trialkyltetrahydrophthalic anhydride.

Among these, in view of obtaining the curable composition having excellent curability and heat resistance in the cured product, a glycoluril compound, a urea compound, and a resol resin are preferable, and a glycoluril compound is particularly preferable.

In view of obtaining the composition having excellent curability, the blending amount of the curing agent in the curable composition of the present invention is preferably 0.5 to 50 parts by mass with respect to 100 parts by mass of the total of the resin containing phenolic hydroxyl groups of the present invention and the other resin (E).

In the case where the curable composition of the present invention is used for a resist underlayer film (BARC film), a composition for a resist underlayer film can be prepared by adding the resin containing phenolic hydroxyl groups of the present invention, the curing agent, and as necessary, the other resin (E) and various additives such as a surfactant, a dye, a filler, a crosslinking agent, and a dissolution promotor, and dissolving the above components in an organic solvent.

The organic solvent used for the composition for a resist underlayer film is not particularly limited, and examples thereof include alkylene glycol monoalkyl ether such as ethylene glycol monomethyl ether, ethylene glycol monoethyl ether, ethylene glycol monopropyl ether, ethylene glycol monobutyl ether, and propylene glycol monomethyl ether; dialkylene glycol dialkyl ether such as diethylene glycol dimethyl ether, diethylene glycol diethyl ether, diethylene glycol dipropyl ether, and diethylene glycol dibutyl ether; alkylene glycol alkyl ether acetate such as ethylene glycol monomethyl ether acetate, ethylene glycol monoethyl ether acetate, and propylene glycol monomethyl ether acetate; a ketone compound such as acetone, methyl ethyl ketone, cyclohexanone, and methyl amyl ketone; a cyclic ether such as dioxane; and an ester compound such as methyl 2-hydroxypropionate, ethyl 2-hydroxypropionate, ethyl 2-hydroxy-2-methylpropionate, ethyl ethoxyacetate, ethyl oxyacetate, methyl 2-hydroxy-3-methylbutanoate, 3-methoxybutyl acetate, 3-methyl-3-methoxybutyl acetate, ethyl formate, ethyl acetate, butyl acetate, methyl acetoacetate, and ethyl acetoacetate. Each of these organic solvents may be used singly, or two or more kinds thereof may be used in combination.

The composition for a resist underlayer film can be prepared by blending each of the components and performing mixing with a stirrer or the like. In the case where the composition for a resist underlayer film includes a filler or a pigment, the composition can be prepared by dispersing or mixing the components with a dispersing device such as a dissolver, a homogenizer, and a three roll mill.

In the case where the resist underlayer film is prepared from the composition for a resist underlayer film, the resist underlayer film is formed by a method in which an object to be subjected to photolithography such as a silicon substrate is coated with the composition for a resist underlayer film, and the composition is dried under the temperature condition of 100° C. to 200° C., and then thermally cured under the temperature condition of 250° C. to 400° C. Next, a resist pattern can be formed using a multilayer resist method by performing a conventional photolithography operation on the underlayer film so as to form a resist pattern and performing a dry etching treatment using a halogen-based plasma gas or the like.

In the case where the curable composition of the present invention is used for a resist permanent film, a composition for a resist permanent film can be prepared by adding the resin containing phenolic hydroxyl groups of the present invention, the curing agent, and as necessary, the other phenol resin (E) and various additives such as a surfactant, a dye, a filler, a crosslinking agent, and a dissolution promotor, and dissolving the above components in an organic solvent. Examples of the organic solvent used here are the same as the examples of the organic solvents used for the composition for a resist underlayer film.

In a photolithography method using the composition for a resist permanent film, for example, the resin component and the additive components are dissolved and dispersed in the organic solvent and then applied onto an object to be subjected to photolithography, such as silicon substrate, and prebaking is performed under a temperature condition of 60° C. to 150° C. A coating method used here may be any method such as spin coating, roll coating, flow coating, dip coating, spray coating, and doctor blade coating. Next, a resist pattern is created, however, in the case where the composition for a resist permanent film is a positive-tone composition, a resist pattern is formed by performing exposure through a prescribed mask to provide a desired resist pattern and dissolving the exposed portion with an alkali developer.

In the case of a semiconductor device, for example, a permanent film formed of the composition for a resist permanent film can be suitably used in a packaging adhesive layer for a solder resist, a packaging material, an underfill material, and a circuit element, or an adhesive layer between an integrated circuit element and a circuit substrate, and in the case of a thin display represented by LCD and OLED, the permanent film formed from the composition for a resist permanent film can be suitably used in a thin film transistor protective film, a liquid crystal color filter protective film, a black matrix, or a spacer.

EXAMPLES

The present invention will be described in more detail using the following specific examples. The number average molecular weight (Mn), the weight average molecular weight (Mw), and the polydispersity (Mw/Mn) of a synthesized resin were measured by GPC under the following measurement condition.

[Measurement Condition for GPC]
Measurement device: "HLC-8220 GPC" manufactured by TOSOH CORPORATION
Column: "Shodex KF802" (8.0 mmφ×300 mm) manufactured by SHOWA DENKO K.K.+"Shodex KF802" (8.0 mmφ×300 mm) manufactured by SHOWA DENKO K.K. +"Shodex KF803" (8.0 mmφ×300 mm) manufactured by SHOWA DENKO K.K.+"Shodex KF804" (8.0 mmφ×300 mm) manufactured by SHOWA DENKO K.K.
Column temperature: 40° C.
Detector: RI (differential refractometer)
Data processing: "GPC-8020 MODEL II VERSION 4.30" manufactured by TOSOH CORPORATION
Eluent: tetrahydrofuran
Flow rate: 1.0 mL/min
Sample: a sample obtained by filtering 0.5% by mass (in terms of a resin solid content) of tetrahydrofuran solution through a microfilter
Injection volume: 0.1 mL
Standard sample: the following monodisperse polystyrene (Standard sample: monodisperse polystyrene)
"A-500" manufactured by TOSOH CORPORATION
"A-2500" manufactured by TOSOH CORPORATION
"A-5000" manufactured by TOSOH CORPORATION
"F-1" manufactured by TOSOH CORPORATION
"F-2" manufactured by TOSOH CORPORATION
"F-4" manufactured by TOSOH CORPORATION
"F-10" manufactured by TOSOH CORPORATION
"F-20" manufactured by TOSOH CORPORATION In measurement of the $^{13}$C-NMR spectrum, a DMSO-$d_6$ solution of the sample was analyzed using "AL-400" manufactured by JEOL Ltd., so as to perform structural analysis. The measurement condition for the $^{13}$C-NMR spectrum is shown below.

[Measurement Condition for $^{13}$C-NMR Spectrum]
Measurement mode: SGNNE (1H complete decoupling method of NOE elimination)
Pulse angle: 45° C. pulse
Sample concentration: 30 wt %
Cumulative number: 10,000 times Production Example 1

Figure 2:
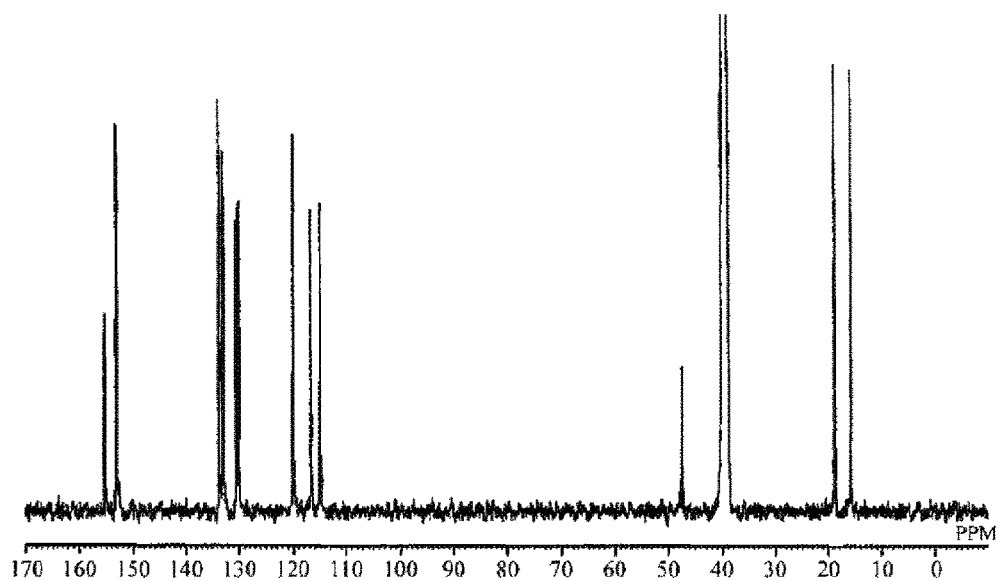
FIG. 2 is a $^{13}$C-NMR chart diagram of the triarylmethane compound (A-1) obtained in Production Example 1.

Production of triarylmethane compound (A-1)
A 3,000 ml four-neck flask equipped with a cooling tube was charged with 586.4 g (4.8 mol) of 2,5-xylenol and 244 g (2 mol) of 4-hydroxybenzaldehyde, which were then dissolved in 1,000 ml 2-ethoxyethanol. While being cooled in an ice bath, 30 ml of sulfuric acid was added thereto, and then heating and stirring were performed for two hours at 100° C. with a mantle heater to thereby perform a reaction. After the reaction, water was added to the obtained solution, and the crude product was reprecipitated. The obtained crude product was redissolved in acetone and further reprecipitated in water. The precipitate was then isolated by filtration, and vacuum drying was performed, thereby obtaining 213 g of a white crystal of triarylmethane compound (A-1). The generation of a compound represented by the following structural formula was confirmed by $^{13}$C-NMR and GPC analysis. In addition, the purity calculated from a GPC chart diagram was 98.2%. The GPC chart of the triarylmethane compound (A-1) is shown in FIG. 1, and the $^{13}$C-NMR chart is shown in FIG. 2.

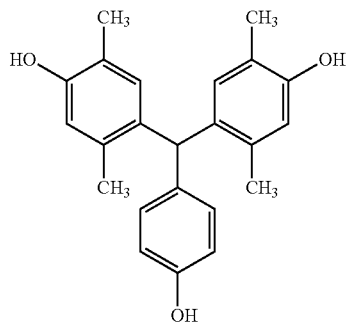

[Chem. 12]

Production Example 2

Figure 3:
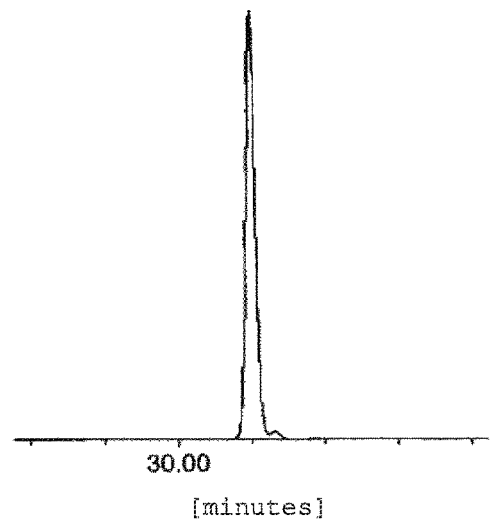
FIG. 3 is a GPC chart diagram of the triarylmethane compound (A-2) obtained in Production Example 2.
Figure 4:
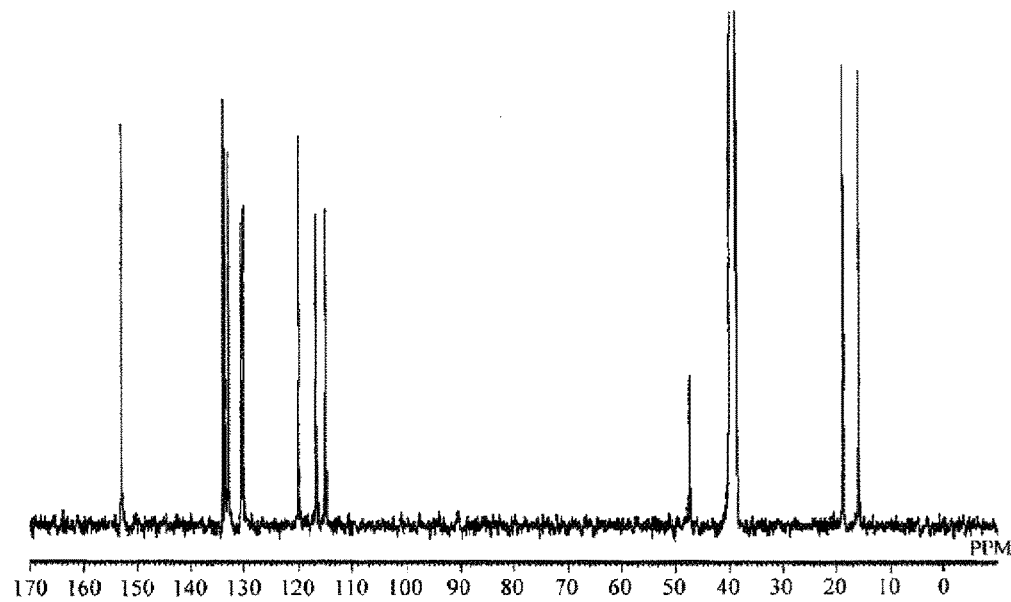
FIG. 4 is a $^{13}$C-NMR chart diagram of a triarylmethane compound (A-2) obtained in Production Example 2.

Production of Triarylmethane Compound (A-2)
413 g of a white crystal of triarylmethane compound (A-2) was obtained in the same manner as in Production Example 1 except that 212.2 g (2 mol) of benzaldehyde was used instead of 244 g (2 mol) of 4-hydroxybenzaldehyde. The generation of a compound represented by the following structural formula was confirmed by $^{13}$C-NMR and GPC analysis. In addition, the purity calculated from a GPC chart diagram was 98.7%. The GPC chart of the triarylmethane compound (A-2) is shown in FIG. 3, and the $^{13}$C-NMR chart is shown in FIG. 4.

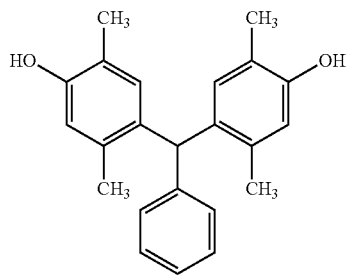

[Chem. 13]

Production Example 3

Production of novolac resin intermediate (1)
A 3,000 ml four-neck flask equipped with a cooling tube was charged with 348 g (1 mol) of the triarylmethane compound (A-1), which was then dissolved in 500 ml of 2-ethoxyethanol and 500 ml of acetic acid. While being cooled in an ice bath, 50 ml of sulfuric acid was added thereto, and then 33 g (1 mol) of 92% paraformaldehyde was charged and the temperature was raised to 80° C. in the oil bath. The reaction was continued by heating and stirring for 10 hours, water was added to the obtained reaction mixture, and a reprecipitation operation was carried out so as to obtain a crude product. The crude product was redissolved in acetone and further reprecipitated with water, then the obtained product was separated by filtration and vacuum dried so as to obtain 330 g of a novolac resin intermediate (1) as a red powder. A GPC chart of the novolac resin intermediate (1) is shown in FIG. 3. The novolac resin intermediate (1) had a hydroxyl group equivalent of 365 g/equivalent, a number average molecular weight (Mn) of 2,909, a weight average molecular weight (Mw) of 14,426, and a polydispersity index (Mw/Mn) of 4.96.

Production Example 4

Production of Novolac Resin Intermediate (2)

324 g of a novolac resin intermediate (2) was obtained in the same manner as in Production Example 3 except that 174 g (0.5 mol) of a triarylmethane compound (A-1) and 166 g (0.5 mol) of a triarylmethane compound (A-2) were used instead of 348 g (1 mol) of the triarylmethane compound (A-1). The novolac resin intermediate (2) had a hydroxyl group equivalent of 710 g/equivalent, a number average molecular weight (Mn) of 2,529, a weight average molecular weight (Mw) of 11,421, and a polydispersity index (Mw/Mn) of 4.52.

Example 1

Production of Resin Containing Phenolic Hydroxyl Groups (1)

A 300 ml four-neck flask equipped with a cooling tube was charged with 30 g of the novolac resin intermediate (1) synthesized in Production Example 3 and 1.5 g of 1-dodecene as a fatty chain introducing agent, which were then dissolved in 100 ml of 2-ethoxyethanol. While being cooled in an ice bath, 10 ml of sulfuric acid was added thereto, and then heating and stirring were performed for six hours by raising the temperature to 80° C. in an oil bath to thereby perform a reaction. After the reaction, water was added to the obtained solution, and the crude product was obtained by carrying out a reprecipitation operation. A mixed solvent of methanol/n-hexane was added to the crude product, and a reprecipitation operation was carried out. The obtained product was separated by filtration and dried under vacuum so as to obtain 29 g of a resin containing phenolic hydroxyl groups (1) as a red powder. A GPC chart of the resin containing phenolic hydroxyl groups (1) is shown in FIG. 4. The resin containing phenolic hydroxyl groups (1) had a number average molecular weight (Mn) of 2,369, a weight average molecular weight (Mw) of 13,583, and a polydispersity index (Mw/Mn) of 4.56.

Example 2

Production of Resin Containing Phenolic Hydroxyl Groups (2)

Figure 5:
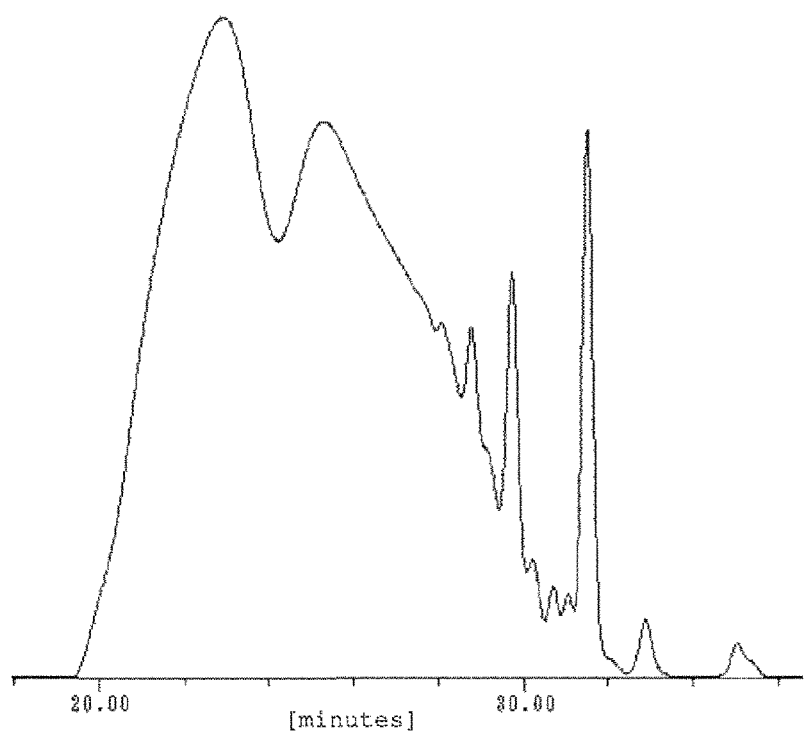
FIG. 5 is a GPC chart diagram of a novolac resin intermediate (1) obtained in Production Example 3.

32 g of a resin containing phenolic hydroxyl groups (2) was obtained in the same manner as in Example 1 except that 1.5 g of 1-dodecene was changed to 7.5 g of 1-dodecene. A GPC chart of the resin containing phenolic hydroxyl groups (2) is shown in FIG. 5. The resin containing phenolic hydroxyl groups (2) had a number average molecular weight (Mn) of 2,394, a weight average molecular weight (Mw) of 14,038, and a polydispersity index (Mw/Mn) of 4.60.

Example 3

Production of Resin Containing Phenolic Hydroxyl Groups (3)

Figure 6:
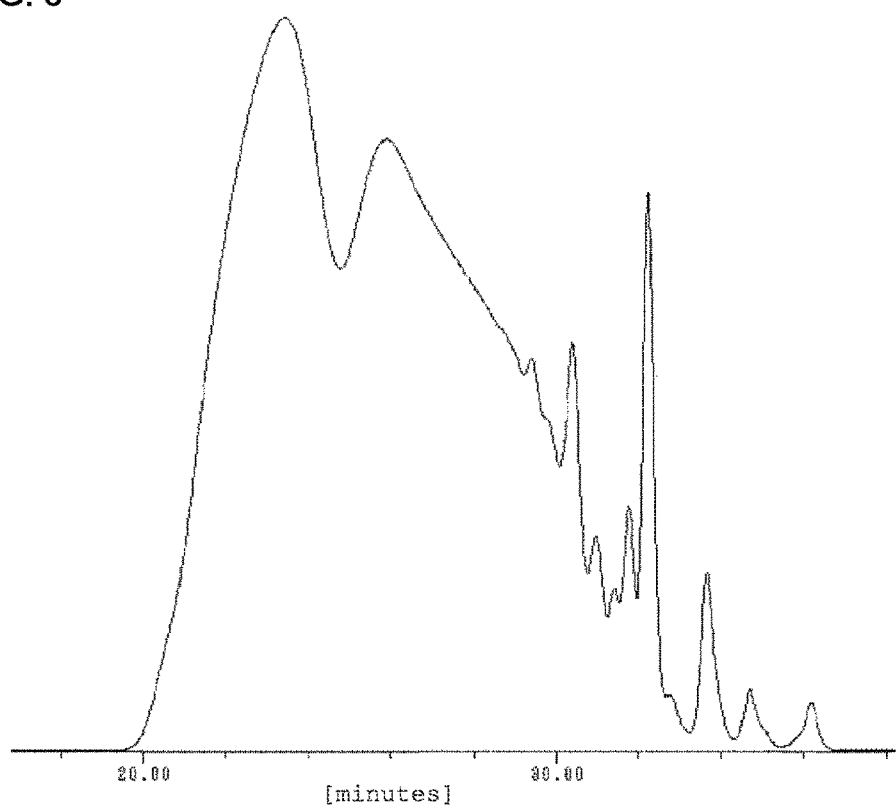
FIG. 6 is a GPC chart diagram of a resin containing phenolic hydroxyl groups (1) obtained in Example 1.

31 g of a resin containing phenolic hydroxyl groups (3) was obtained in the same manner as in Example 1 except that 1.5 g of 1-dodecene was changed to 1.5 g of 1-tetradecene. A GPC chart of the resin containing phenolic hydroxyl groups (3) is shown in FIG. 6. The resin containing phenolic hydroxyl groups (3) had a number average molecular weight (Mn) of 2,347, a weight average molecular weight (Mw) of 13,559, and a polydispersity index (Mw/Mn) of 4.54.

Example 4

Production of Resin Containing Phenolic Hydroxyl Groups (4)

Figure 7:
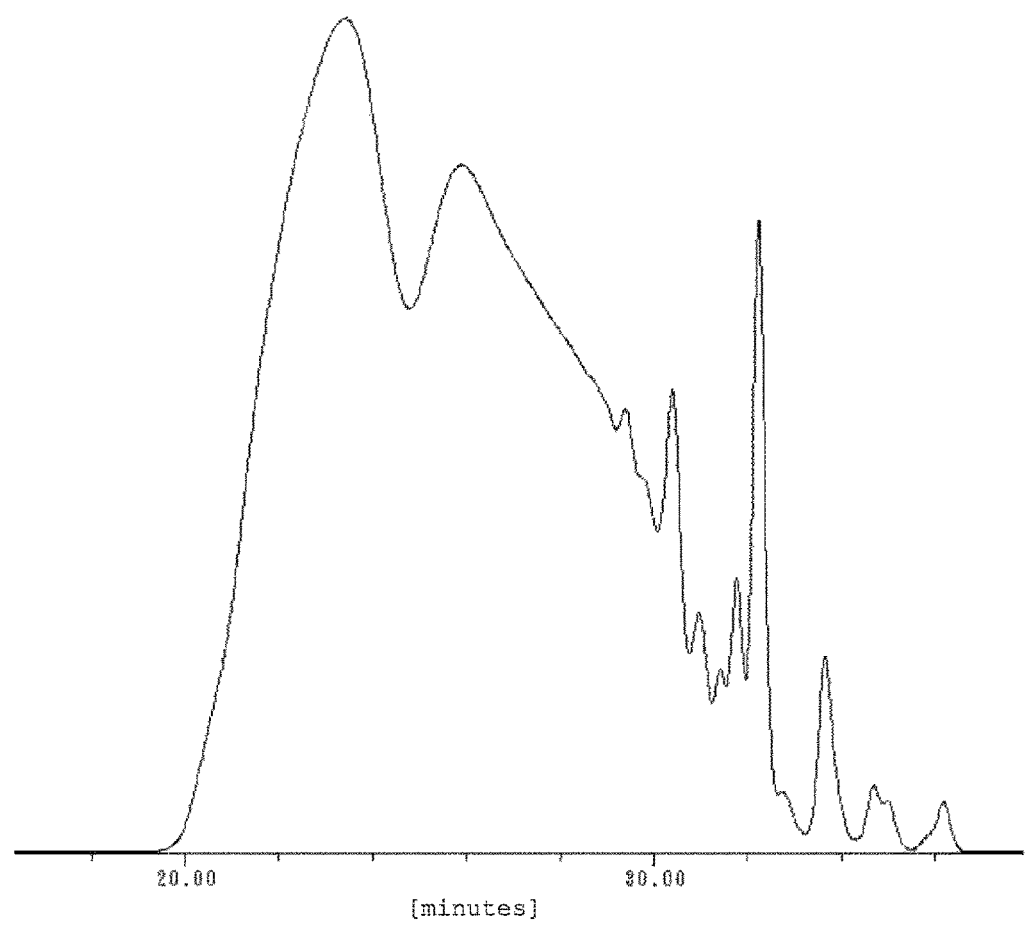
FIG. 7 is a GPC chart diagram of a resin containing phenolic hydroxyl groups (2) obtained in Example 2.

29 g of a resin containing phenolic hydroxyl groups (4) was obtained in the same manner as in Example 1 except that 1.5 g of 1-dodecene was changed to 1.5 g of 1-hexadecene. A GPC chart of the resin containing phenolic hydroxyl groups (4) is shown in FIG. 7. The resin containing phenolic hydroxyl groups (4) had a number average molecular weight (Mn) of 2,446, a weight average molecular weight (Mw) of 14,419, and a polydispersity index (Mw/Mn) of 4.62.

Example 5

Production of Resin Containing Phenolic Hydroxyl Groups (5)

Figure 8:
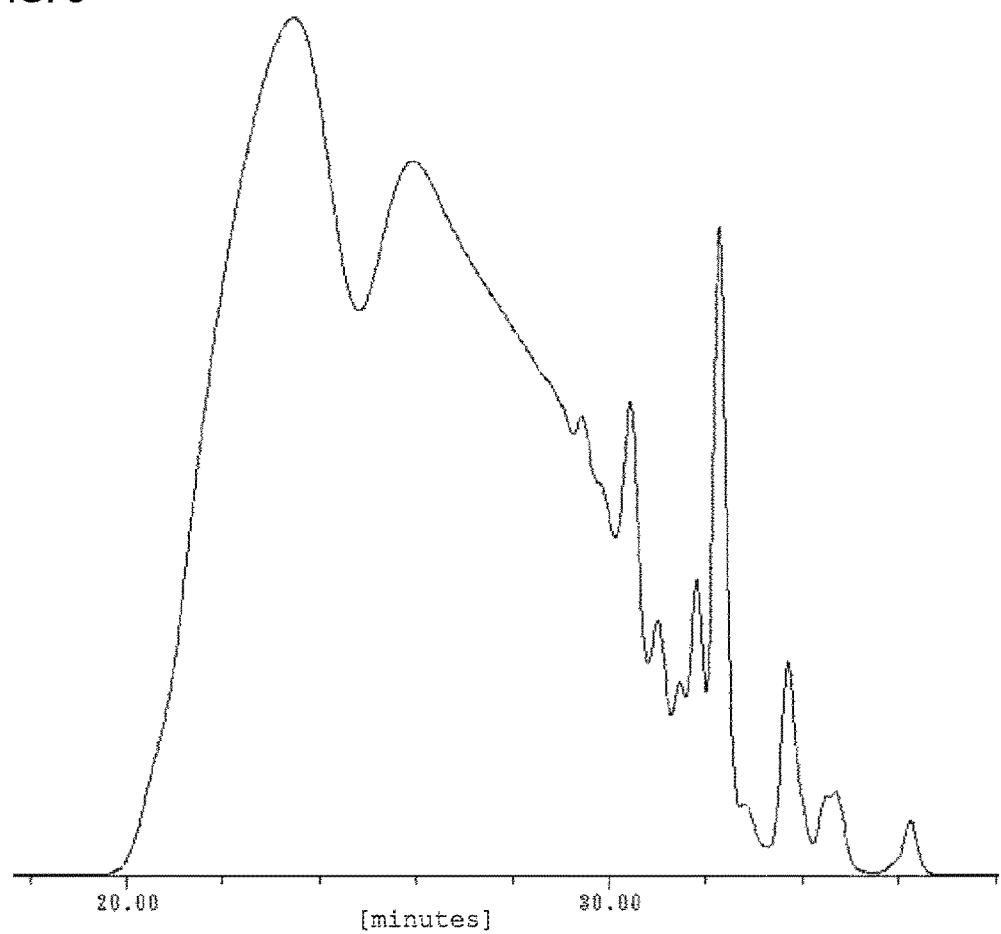
FIG. 8 is a GPC chart diagram of a resin containing phenolic hydroxyl groups (3) obtained in Example 3.

29 g of a resin containing phenolic hydroxyl groups (5) was obtained in the same manner as in Example 1 except that 1.5 g of 1-dodecene was changed to 1.5 g of 1-octadecene. A GPC chart of the resin containing phenolic hydroxyl groups (5) is shown in FIG. 8. The resin containing phenolic hydroxyl groups (5) had a number average molecular weight (Mn) of 2,454, a weight average molecular weight (Mw) of 14,352, and a polydispersity index (Mw/Mn) of 4.71.

Example 6

Production of Resin Containing Phenolic Hydroxyl Groups (6)

Figure 9:
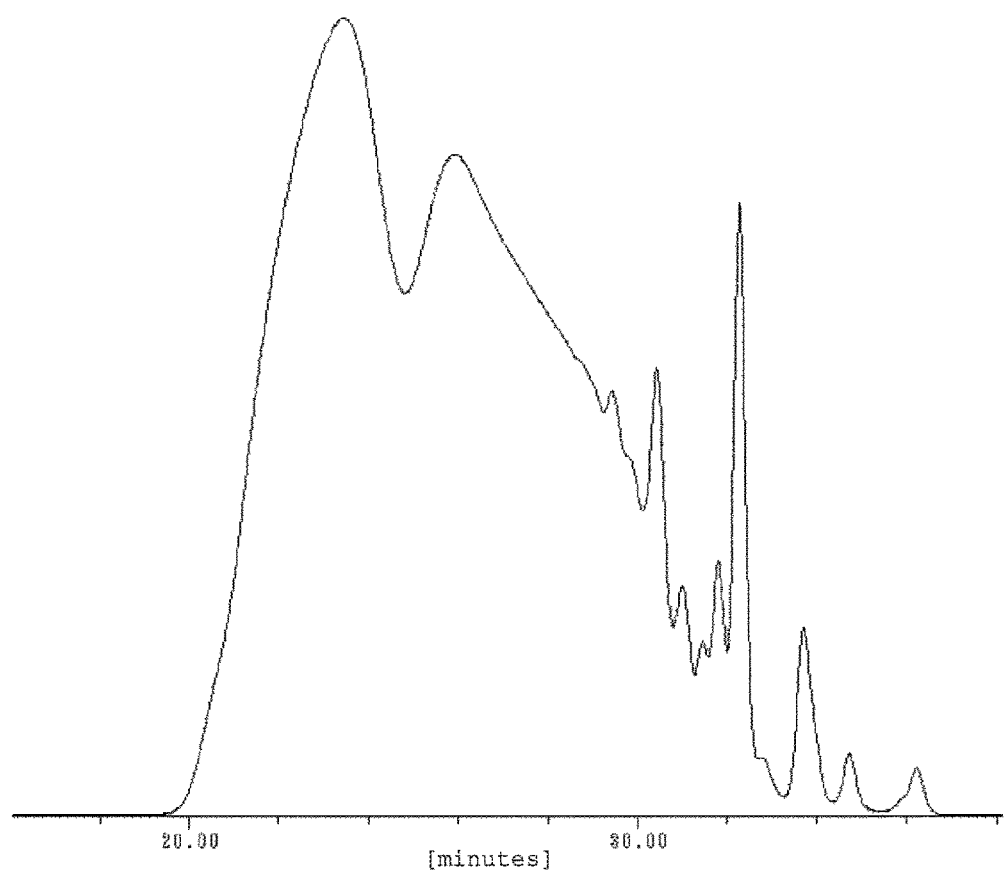
FIG. 9 is a GPC chart diagram of a resin containing phenolic hydroxyl groups (4) obtained in Example 4.

29 g of a resin containing phenolic hydroxyl groups (6) was obtained in the same manner as in Example 1 except that 1.5 g of 1-dodecene was changed to 1.5 g of a 56:44 (molar ratio) mixture of 1-dodecene and 1-tetradecene ("Linearene 124" manufactured by Idemitsu Kosan Co., Ltd.) A GPC chart of the resin containing phenolic hydroxyl groups (6) is shown in FIG. 9. The resin containing phenolic hydroxyl groups (6) had a number average molecular weight (Mn) of 2,370, a weight average molecular weight (Mw) of 13,329, and a polydispersity index (Mw/Mn) of 4.53.

Example 7

Production of Resin Containing Phenolic Hydroxyl Groups (7)

Figure 10:
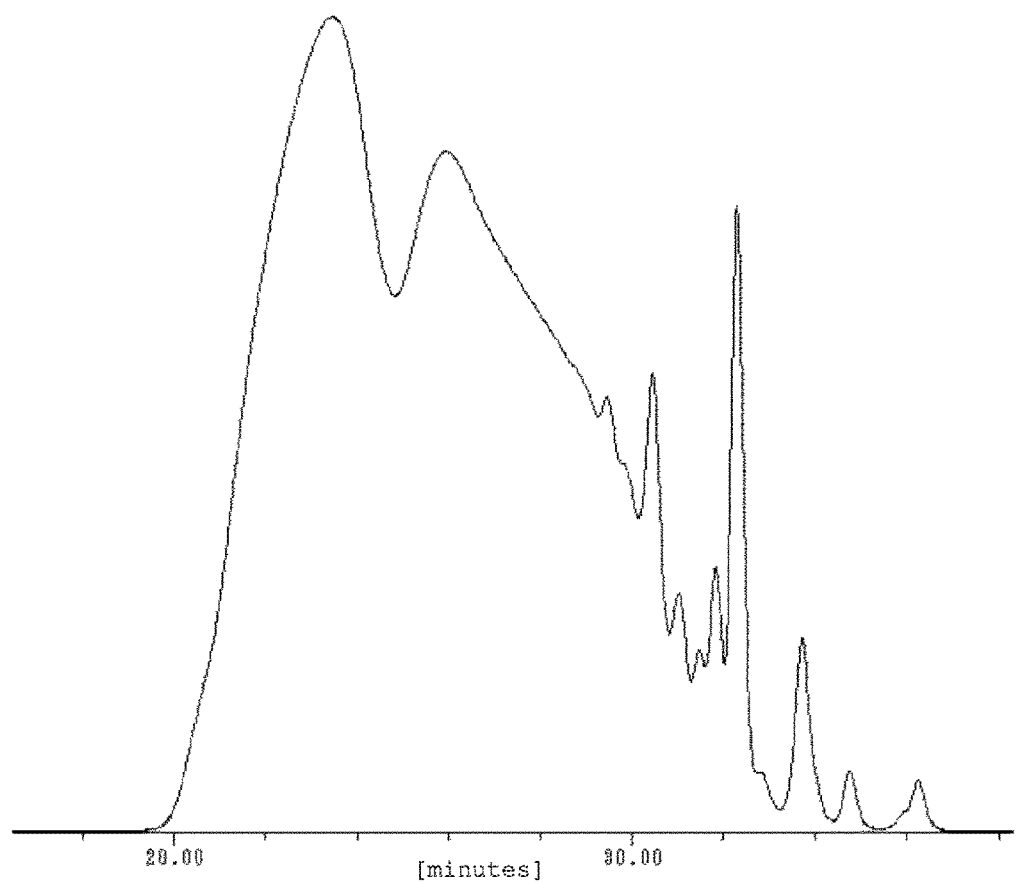
FIG. 10 is a GPC chart diagram of a resin containing phenolic hydroxyl groups (5) obtained in Example 5.

30 g of a resin containing phenolic hydroxyl groups (7) was obtained in the same manner as in Example 1 except that 1.5 g of 1-dodecene was changed to 1.5 g of a 35:37:28 (molar ratio) mixture of 1-tetradecene, 1-hexadecene, 1-octadecene ("Linearene 148" manufactured by Idemitsu Kosan Co., Ltd.) A GPC chart of the resin containing phenolic hydroxyl groups (7) is shown in FIG. 10. The resin containing phenolic hydroxyl groups (7) had a number average molecular weight (Mn) of 2,436, a weight average molecular weight (Mw) of 14,103, and a polydispersity index (Mw/Mn) of 5.79.

Example 8

Production of Resin Containing Phenolic Hydroxyl Groups (8)

Figure 11:
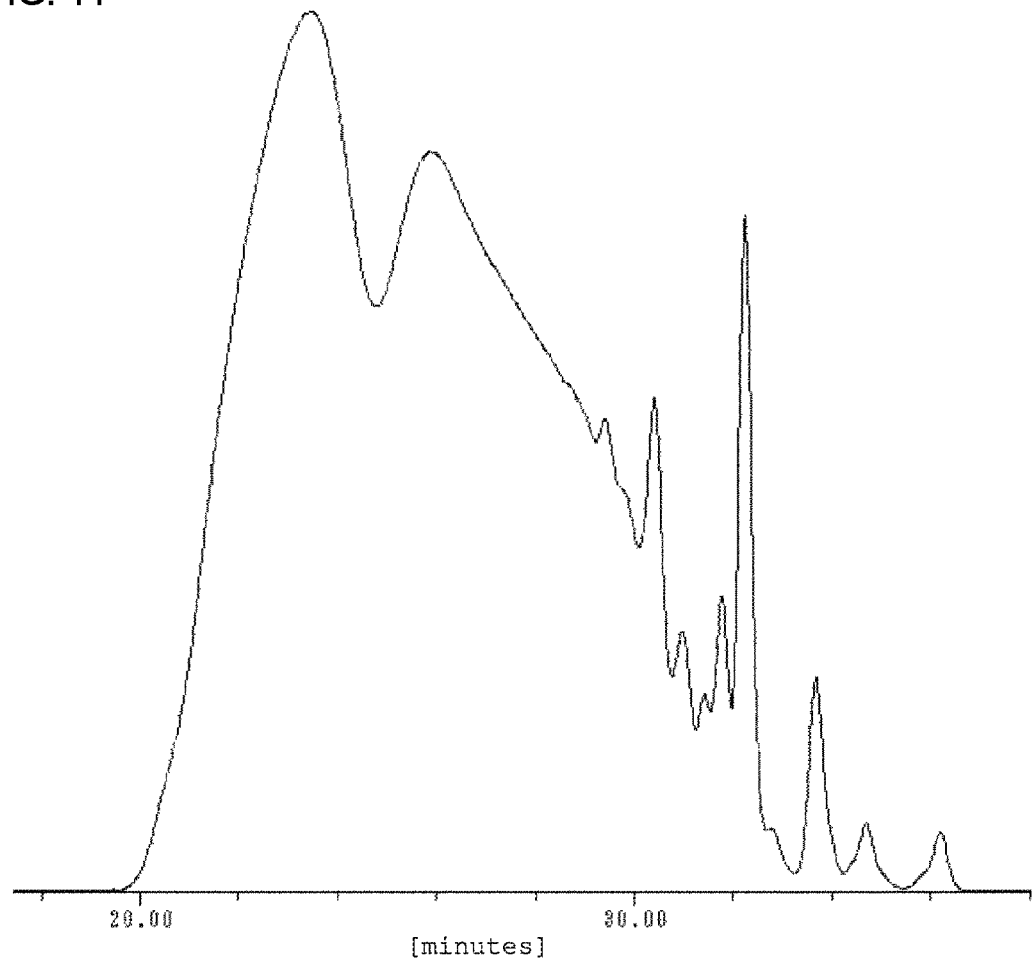
FIG. 11 is a GPC chart diagram of a resin containing phenolic hydroxyl groups (6) obtained in Example 6.
Figure 12:
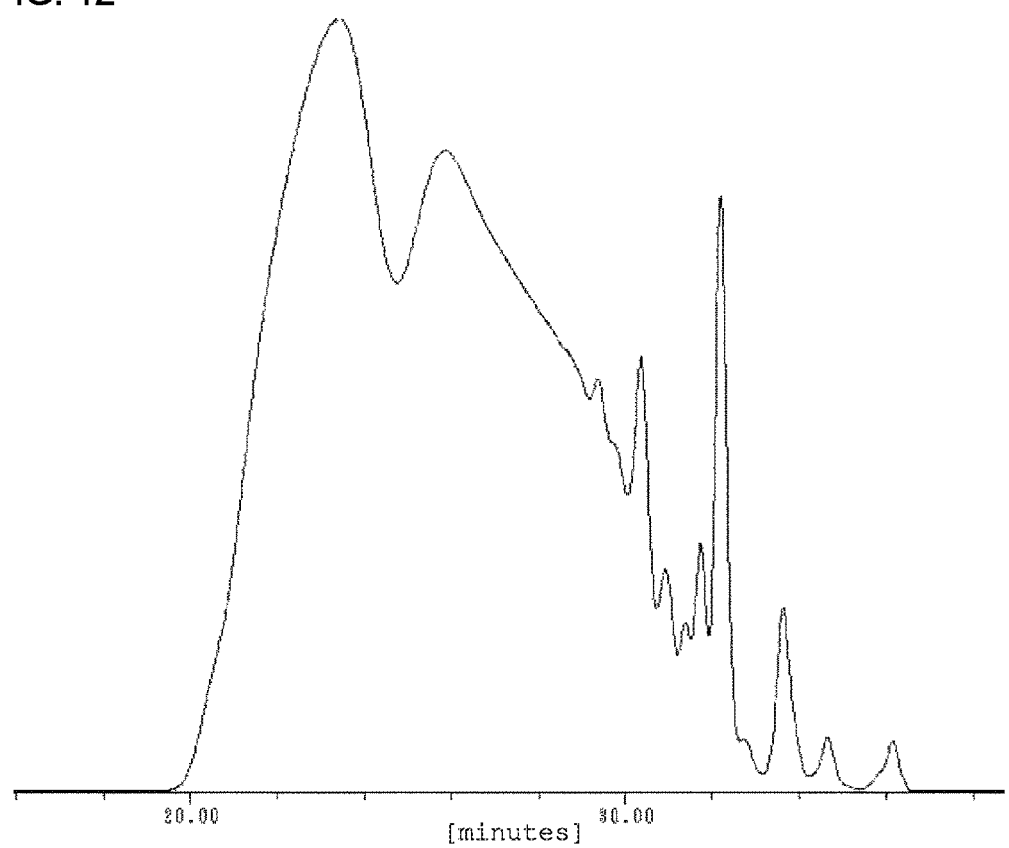
FIG. 12 is a GPC chart diagram of a resin containing phenolic hydroxyl groups (7) obtained in Example 7.
Figure 13:
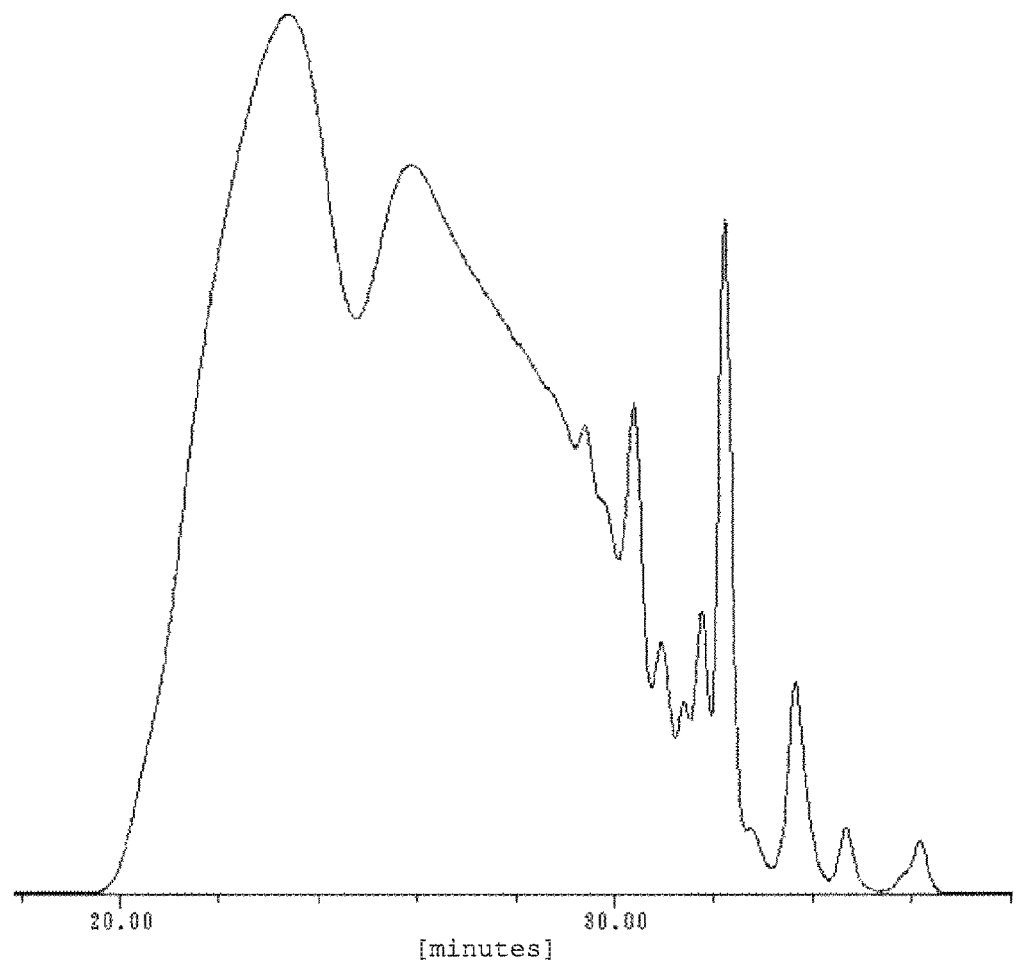
FIG. 13 is a GPC chart diagram of a resin containing phenolic hydroxyl groups (8) obtained in Example 8.

30 g of a resin containing phenolic hydroxyl groups (8) was obtained in the same manner as in Example 1 except that 1.5 g of 1-dodecene was changed to 1.5 g of a 57:43 (molar ratio) mixture of 1-hexadecene and 1-octadecene ("Linearene 168" manufactured by Idemitsu Kosan Co., Ltd.) A GPC chart of the resin containing phenolic hydroxyl groups (8) is shown in FIG. 11. The resin containing phenolic hydroxyl groups (8) had a number average molecular weight (Mn) of 2,420, a weight average molecular weight (Mw) of 14,092, and a polydispersity index (Mw/Mn) of 4.56.

Example 9

Production of Resin Containing Phenolic Hydroxyl Groups (9)

28 g of a resin containing phenolic hydroxyl groups (9) was obtained in the same manner as in Example 1 except that 30 g of the novolac resin intermediate (1) was changed to 30 g of the novolac resin intermediate (2). The resin containing phenolic hydroxyl groups (9) had a number average molecular weight (Mn) of 2,352, a weight average molecular weight (Mw) of 10,536, and a polydispersity index (Mw/Mn) of 4.48.

Comparative Production Example 1

Production of Resin Containing Phenolic Hydroxyl Groups (1')

A 300 ml four-neck flask equipped with a cooling tube was charged with 13.0 g (0.12 mol) of m-cresol, 8.6 g (0.08 mol) of p-cresol, and 6.1 g (0.02 mol) of 3-pentadecylphenol, which were then dissolved in 15 ml of 2-ethoxyethanol and 15 ml of acetic acid. While being cooled in an ice bath, 10 ml of sulfuric acid was added thereto, and then 6.5 g (0.2 mol) of 92% paraformaldehyde was charged. The heating and stirring were performed for ten hours by raising the temperature to 80° C. in an oil bath to thereby perform a reaction. After the reaction, water was added to the obtained solution, and the crude product was reprecipitated. The obtained crude product was redissolved in acetone and further reprecipitated in water. The precipitate was then isolated by filtration, and vacuum drying was performed, thereby 24.6 g of yellow powder resin containing phenolic hydroxyl groups (1'). The resin containing phenolic hydroxyl groups (1') had a number average molecular weight (Mn) of 1,792, a weight average molecular weight (Mw) of 11,701, and a polydispersity index (Mw/Mn) of 6.53.

Examples 10 to 18, and Comparative Example 1

The resin containing phenolic hydroxyl groups obtained in Examples 1 to 9 and Comparative Production Example 1 was evaluated in the following manner. The results are indicated in Table 1.

Preparation of Photosensitive Composition 28 parts by mass of the resin containing phenolic hydroxyl groups was dissolved in 60 parts by mass of propylene glycol monomethyl ether acetate, and 12 parts by mass of the photosensitizing agent was added to the solution and dissolved. This solution was filtered through a 0.2 µm membrane filter, and a photosensitive composition was obtained.

As the photosensitizing agent, "P-200" (a condensate of 1 mol of 4,4'-[1-[4-[1-(4-hydroxyphenyl)-1methylethyl]phenyl]ethylidene]bisphenol and 2 mol of 1,2-naphthoquinone-2-diazide-5-sulfonyl chloride) manufactured by Toyo Gosei Co., Ltd. was used.

Preparation of Composition for Testing Heat Resistance 28 parts by mass of the resin containing phenolic hydroxyl groups was dissolved in 60 parts by mass of propylene glycol monomethyl ether acetate, and this solution was filtered through a 0.2 µm membrane filter, thereby obtaining a composition for testing heat resistance.

Evaluation of Alkali Developability [ADR (Angstrom/s)]

A 5-inch silicon wafer was coated with the photosensitive composition obtained above with a spin coater such that the thickness of the composition became approximately 1 µm, and the composition was dried on a hot plate at 110° C. for 60 seconds. Two wafers were prepared in such way, and one was designated as a "sample without exposure". The other one was used as an "exposed sample" and was irradiated with a ghi line at 100 mJ/cm$^2$ using a ghi line lamp ("MULTILIGHT" manufactured by USHIO INC.) and was subjected to a heating treatment at 140° C. for 60 seconds.

Both of the "sample without exposure" and the "exposed sample" were immersed in an alkali developer (2.38% tetramethylammonium hydroxide aqueous solution) for 60 seconds, and then the samples were dried on a hot plate at 110° C. for 60 seconds. Film thicknesses of each sample before and after the immersion in the developer were measured, and a value obtained by dividing the difference in the thickness by 60 was designated as alkali developability [ADR (angstrom/s)].

Evaluation of Optical Sensitivity

A 5-inch silicon wafer was coated with the photosensitive composition obtained above with a spin coater such that the thickness of the composition became approximately 1 µm, and the composition was dried on a hot plate at 110° C. for 60 seconds. A mask corresponding to a resist pattern in which the line and space was 1:1 and a line width was set within 1 to 10 µm in increments of 1 µm was adhered onto the wafer, the wafer was irradiated with a ghi line using a ghi line lamp ("MULTILIGHT" manufactured by USHIO INC.), and then subjected to a heating treatment at 140° C. for 60 seconds. Next, the wafer was immersed in an alkali developer (2.38% tetramethylammonium hydroxide aqueous solution) for 60 seconds and dried on a hot plate at 110° C. for 60 seconds.

In the case where the exposure amount of the ghi line was increased from 30 mJ/cm$^2$ in increments of 5 mJ/cm$^2$, an exposure amount (Eop exposure amount) at which a line width of 3 µm was able to be faithfully reproduced was evaluated.

Evaluation of Resolution

A 5-inch silicon wafer was coated with the photosensitive composition obtained above with a spin coater such that the thickness of the composition became approximately 1 µm, and the composition was dried on a hot plate at 110° C. for 60 seconds. A photomask was placed on the obtained wafer, the wafer was irradiated with a ghi line at 200 mJ/cm$^2$, using the same method as in the case of the evaluation of alkali developability above, and an alkali developing operation was performed. A state of a pattern was confirmed using a laser microscope ("VK-X200" manufactured by KEYENCE CORPORATION.), and a pattern that was able to be resolved at L/S=5 µm was evaluated as A, and a pattern that was not able to be resolved at L/S=5 µm was evaluated as B.

became approximately 5 µm, and the composition was dried on a hot plate at 110° C. for 300 seconds. The obtained stacked film was bent at 180 degrees, and the state of the folded portion was observed with a laser microscope ("VK-X200" manufactured by Keyence Corporation), and was evaluated as "A" in the case where there was no crack, and was evaluated as "B" in the case where there was crack.

TABLE 1

|  |  | Example 10 | Example 11 | Example 12 | Example 13 | Example 14 |
|---|---|---|---|---|---|---|
| Resin containing phenolic hydroxyl groups |  | (1) | (2) | (3) | (4) | (5) |
| Alkali developability (angstrom/s) | Sample without exposure | 0 | 0 | 0 | 0 | 0 |
|  | Exposed sample | 1200 | 1600 | 1400 | 1300 | 1500 |
| Optical sensitivity [mJ/cm$^2$] |  | 100 | 100 | 100 | 100 | 100 |
| Resolution |  | A | A | A | A | A |
| Heat resistance [° C.] |  | 247 | 242 | 223 | 240 | 242 |
| Substrate followability |  | A | A | A | A | A |
| Flexibility |  | A | A | A | A | A |
|  |  | Example 15 | Example 16 | Example 17 | Example 18 | Comparative Example 1 |
| Resin containing phenolic hydroxyl groups |  | (6) | (7) | (8) | (9) | (1') |
| Alkali developability (angstrom/s) | Sample without exposure | 0 | 0 | 0 | 0 | 0 |
|  | Exposed sample | 1300 | 1300 | 1600 | 1200 | 240 |
| Optical sensitivity [mJ/cm$^2$] |  | 100 | 100 | 100 | 100 | 450 |
| Resolution |  | A | A | A | A | B |
| Heat resistance [° C.] |  | 234 | 242 | 221 | 213 | 125 |
| Substrate followability |  | A | A | A | A | A |
| Flexibility |  | A | A | A | A | A |

Evaluation of Heat Resistance

A 5-inch silicon wafer was coated with the composition for testing heat resistance obtained above with a spin coater such that the thickness of the composition became approximately 1 µm, and the composition was dried on a hot plate at 110° C. for 60 seconds. A resin was scraped off from the obtained wafer, and a glass transition temperature (Tg) of the resin was measured. The glass transition temperature (Tg) was measured using a differential scanning calorimeter (DSC) ("Q100" manufactured by TA Instruments) under a nitrogen atmosphere and under the condition of a temperature range of −100° C. to 250° C. and a temperature rising at a rate of 10° C./min.

Substrate Followability

A 5-inch silicon wafer was coated with the photosensitive composition obtained above with a spin coater such that the thickness of the composition became approximately 50 µm, and the composition was dried on a hot plate at 110° C. for 300 seconds. The surface of the obtained wafer was observed with a laser microscope ("VK-X200" manufactured by Keyence Corporation), and was evaluated as "A" in the case where there was no crack, and was evaluated as "B" in the case where there was crack.

Flexibility

A polyimide film having a thickness of 50 µm was coated with the photosensitive composition obtained above with a spin coater such that the thickness of the composition Examples 19 to 27 and Comparative Example 2

The resins containing phenolic hydroxyl groups obtained in Examples 1 to 9 and Comparative Production Example 1 were evaluated in the following manner. The results are indicated in Table 2.

Preparation of Curable Composition 16 parts by mass of the resin containing phenolic hydroxyl groups and 4 parts by mass of a curing agent ("1,3,4,6-tetrakis (methoxymethyl) glycoluril" manufactured by Tokyo Chemical Industry Co., Ltd.) were dissolved in 30 parts by mass of propylene glycol monomethyl ether acetate, and this solution was filtered through a 0.2 µm membrane filter, thereby obtaining a curable composition.

Preparation of Composition for Testing Heat Resistance 28 parts by mass of the resin containing phenolic hydroxyl groups was dissolved in 60 parts by mass of propylene glycol monomethyl ether acetate, and this solution was filtered through a 0.2 µm membrane filter, thereby obtaining a composition for testing heat resistance.

Evaluation of Alkali Developability [ADR (Angstrom/s)]

A 5-inch silicon wafer was coated with the curable composition obtained above with a spin coater such that the thickness of the composition became approximately 1 µm, and the composition was dried on a hot plate at 110° C. for 60 seconds. Two wafers were prepared in such way, and one was designated as an "uncured sample". The other one was designated as a "cured sample", and a heat treatment was carried out under the condition of 160° C. for 60 seconds.

Both of the "uncured sample" and the "cured sample" were immersed in an alkali developer (2.38% tetramethylammonium hydroxide aqueous solution) for 60 seconds, and then the samples were dried on a hot plate at 110° C. for 60 seconds. Film thicknesses of each sample before and after the immersion in the developer were measured, and a value obtained by dividing the difference in the thickness by 60 was designated as alkali developability [ADR (angstrom's)].

Evaluation of Heat Resistance

A 5-inch silicon wafer was coated with the curable composition obtained above with a spin coater such that the thickness of the composition became approximately 1 μm, the composition was dried on a hot plate at 110° C. for 60 seconds, and then the heat treatment was carried out under the condition of 160° C. for 60 seconds. A resin was scraped off from the obtained wafer, and a glass transition temperature (Tg) of the resin was measured. The glass transition temperature (Tg) was measured using a differential scanning calorimeter (DSC) ("Q100" manufactured by TA Instruments) under a nitrogen atmosphere and under the condition of a temperature range of −100° C. to 250° C. and a temperature rising at a rate of 10° C./min.

Substrate Followability

A 5-inch silicon wafer was coated with the curable composition obtained above with a spin coater such that the thickness of the composition became approximately 50 μm, and the composition was dried on a hot plate at 110° C. for 300 seconds. The surface of the obtained wafer was observed with a laser microscope ("VK-X200" manufactured by Keyence Corporation), and was evaluated as "A" in the case where there was no crack, and was evaluated as "B" in the case where there was crack.

The invention claimed is:

1. A resin containing phenolic hydroxyl groups, comprising, as a repeating unit, a structural moiety represented by Structural Formula (1):

(wherein $R^1$ represents any one of a hydrogen atom, an alkyl group, and an aryl group, and X is a structural moiety (α) represented by Structural Formula (2) or a structural moiety (β) represented by Structural Formula (3):

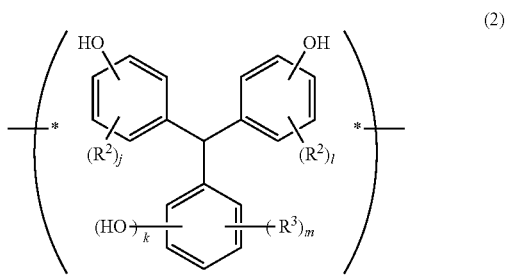

wherein k is any one of 0, 1, and 2, $R^2$'s each independently represent any one of a hydrogen atom, an aliphatic hydrocarbon group, an aromatic ring-containing hydrocarbon group, an alkoxy group, and a halogen atom, l's are each independently an integer of to 4, $R^3$ represents any one of a hydrogen atom, an aliphatic hydrocarbon group, an aromatic ring-containing hydro-

TABLE 2

| | | Example 19 | Example 20 | Example 21 | Example 22 | Example 23 |
|---|---|---|---|---|---|---|
| Resin containing phenolic hydroxyl groups | | (1) | (2) | (3) | (4) | (5) |
| Alkali developability (angstrom/s) | Cured sample | 0 | 0 | 0 | 0 | 0 |
| | Uncured sample | 1000 | 1500 | 1200 | 1000 | 1300 |
| Heat resistance [° C.] | | >250 | >250 | >250 | >250 | >250 |
| Substrate followability | | A | A | A | A | A |

| | | Example 24 | Example 25 | Example 26 | Example 27 | Comparative Example 2 |
|---|---|---|---|---|---|---|
| Resin containing phenolic hydroxyl groups | | (6) | (7) | (8) | (9) | (1') |
| Alkali developability (angstrom/s) | Cured sample | 0 | 0 | 0 | 0 | 0 |
| | Uncured sample | 1100 | 1000 | 1300 | 1000 | 200 |
| Heat resistance [° C.] | | >250 | >250 | >250 | >250 | 156 |
| Substrate followability | | A | A | A | A | A | carbon group, an alkoxy group, and a halogen atom, m is an integer of 1 to 4, asterisks each are a bonding point on any of the three aromatic rings shown in the formula, and two asterisks may be bonded to the same aromatic ring or may be bonded to different aromatic rings:

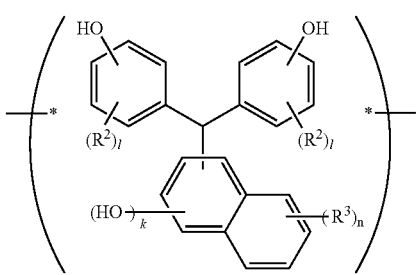

(3)

wherein k is any one of 0, 1, and 2, $R^2$'s each independently represent any one of a hydrogen atom, an aliphatic hydrocarbon group, an aromatic ring-containing hydrocarbon group, an alkoxy group, and a halogen atom, l's are each independently an integer of to 4, $R^3$ represents any one of a hydrogen atom, an aliphatic hydrocarbon group, an aromatic ring-containing hydrocarbon group, an alkoxy group, and a halogen atom, n is an integer of 1 to 6, asterisks each are a bonding point on any of the three aromatic rings shown in the formula, and two asterisks may be bonded to the same aromatic ring or may be bonded to different aromatic rings), wherein at least one of $R^2$ and $R^3$ present in the resin is an aliphatic hydrocarbon group having 9 to 24 carbon atoms, and 20 mol % or more of X is a structural moiety in which a value of k is 1.

2. A composition comprising the resin containing phenolic hydroxyl groups according to claim 1.

3. A cured product, which is formed by curing the composition according to claim 2.

4. The cured product according to claim 3, which is a resist film.

5. A method of producing a resin containing phenolic hydroxyl groups, comprising:
reacting a triarylmethane compound (A) having a molecular structure represented by Structural Formula (4) or (5) with an aldehyde compound (B) as essential components, to thereby obtain a novolac resin intermediate, and
reacting the novolac resin intermediate with an alkene compound (C) having 9 to 24 carbon atoms:

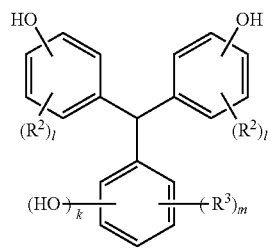

(4)

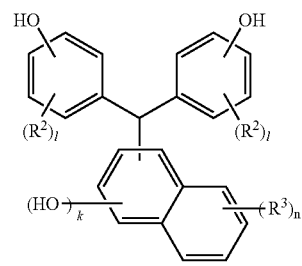

(5)

(wherein k is any one of 0, 1, and 2, $R^2$'s each independently represent any one of a hydrogen atom, an aliphatic hydrocarbon group, an aromatic ring-containing hydrocarbon group, an alkoxy group, and a halogen atom, l's are each independently an integer of to 4, $R^3$ represents any one of a hydrogen atom, an aliphatic hydrocarbon group, an aromatic ring-containing hydrocarbon group, an alkoxy group, and a halogen atom, m is an integer of 1 to 4, and n is an integer of 1 to 6).

* * * * *